US011979122B2

(12) United States Patent
Arai et al.

(10) Patent No.: US 11,979,122 B2
(45) Date of Patent: May 7, 2024

(54) ISOLATION AMPLIFIER AND ANOMALY STATE DETECTION DEVICE

(71) Applicants: Kabushiki Kaisha Toshiba, Tokyo (JP); Toshiba Electronic Devices & Storage Corporation, Tokyo (JP)

(72) Inventors: Makoto Arai, Tachikawa Tokyo (JP); Masaki Nishikawa, Yokohama Kanagawa (JP); Shoji Ootaka, Yokohama Kanagawa (JP); Tadashi Arai, Yokohama Kanagawa (JP); Manabu Yamada, Ota Tokyo (JP); Shigeyasu Iwata, Hamura Tokyo (JP); Takeshi Murasaki, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/468,577

(22) Filed: Sep. 7, 2021

(65) Prior Publication Data

US 2022/0311398 A1 Sep. 29, 2022

(30) Foreign Application Priority Data

Mar. 24, 2021 (JP) ................................ 2021-050691
Aug. 31, 2021 (JP) ................................ 2021-141137

(51) Int. Cl.
*G01R 31/40* (2020.01)
*H03F 3/45* (2006.01)
*H03M 1/12* (2006.01)

(52) U.S. Cl.
CPC ......... *H03F 3/45475* (2013.01); *G01R 31/40* (2013.01); *H03M 1/12* (2013.01)

(58) Field of Classification Search
CPC ................... H03F 3/45475; H03F 3/45; H03F 2203/45512; H03F 2203/45528;
(Continued)

(56) References Cited

U.S. PATENT DOCUMENTS 8,447,185 B2 5/2013 Uo
8,731,407 B2 5/2014 Uo
(Continued)

FOREIGN PATENT DOCUMENTS

CN 110798213 A * 2/2020 ............. H03M 1/08
JP 2011-160096 A 8/2011

*Primary Examiner* — Tarun Sinha
*Assistant Examiner* — James I Burris
(74) *Attorney, Agent, or Firm* — Maier & Maier, PLLC

(57) ABSTRACT

An isolation amplifier of an embodiment includes: a primary circuit including an encoder configured to encode an input signal and output the encoded input signal and an anomaly detection circuit configured to detect anomaly having occurred to the input signal and generate a detection signal; an isolation unit configured to insulate the primary circuit from a secondary circuit; an output circuit configured to generate an output signal corresponding to the input signal; and an anomaly-input sensing-output circuit configured to generate an output signal from the secondary circuit by changing the output signal from the output circuit based on the detection signal.

15 Claims, 28 Drawing Sheets

(58) Field of Classification Search
CPC ......... H03F 2203/45594; G01R 31/40; H03M 1/12; H03M 1/66; H03M 3/458; H03M 3/00
See application file for complete search history.

(56) References Cited

U.S. PATENT DOCUMENTS

| | | | | |
|---|---|---|---|---|
| 2011/0188864 A1* | 8/2011 | Uo | H04B 10/00 | 398/154 |
| 2020/0049742 A1* | 2/2020 | Sato | H02M 3/157 | |
| 2020/0081684 A1* | 3/2020 | Akahori | H03M 1/1076 | |

* cited by examiner

※DETECTION RESULT IN CASE OF AVERAGE $(V_{OUT+} + V_{OUT-})/2$

ISOLATION AMPLIFIER AND ANOMALY STATE DETECTION DEVICE

CROSS-REFERENCE TO RELATED APPLICATION

This application is based upon and claims the benefit of priority from the prior Japanese Patent Application No. 2021-50691 filed in Japan on Mar. 24, 2021 and Japanese Patent Application No. 2021-141137 filed in Japan on Aug. 31, 2021; the entire contents of each of which are incorporated herein by their reference.

FIELD

Embodiments described herein relate generally to an isolation amplifier and an anomaly state detection device.

BACKGROUND

Conventionally, an isolation amplifier has been used as a device that achieves both electric insulation and signal transmission. The isolation amplifier is employed in various applications such as industrial, communication, consumer, on-board fields and used in, for example, data transmission between a motor driven with large power voltage and large current and an MPU (microprocessor unit) configured to control the motor. For example, the isolation amplifier is used to achieve, for example, a current sensor or a voltage sensor configured to detect high voltage or large current of a detection target circuit.

Anomaly occurs to the detection target circuit and excessive input occurs to the isolation amplifier in some cases. In such a case, the isolation amplifier needs to convey the anomaly occurrence in a short time to protect the entire system. However, a speed of conveyance through a data transmission path of the isolation amplifier is relatively low, and a relatively long time is needed to convey a state of anomaly such as excessive input.

In a method for avoiding this, a transmission path different from a usual data transmission path of the isolation amplifier is provided to convey an anomaly state. However, in this case, a dedicated pin is additionally needed for the transmission path.

DETAILED DESCRIPTION

An isolation amplifier of an embodiment includes: a primary circuit including an analog-digital conversion circuit and an encoder, the analog-digital conversion circuit being configured to convert an input signal provided from a detection target device into a digital signal, the encoder being configured to encode and output an output from the analog-digital conversion circuit; an anomaly detection circuit provided in the primary circuit and configured to detect anomaly having occurred to the input signal and generate a detection signal; an isolation unit insulating the primary circuit from a secondary circuit and configured to transmit the output from the encoder and the detection signal to the secondary circuit; an output circuit provided in the secondary circuit, including a decoder, and configured to generate an output signal corresponding to the input signal, the decoder being configured to receive the output from the encoder and the detection signal that are transmitted by the isolation unit and perform decoding corresponding to the encoding; and an anomaly-input sensing-output circuit provided in the secondary circuit and configured to generate an output signal from the secondary circuit by changing, the output signal from the output circuit based on the detection signal and by a predetermined law.

Embodiments of the present invention will be described below in detail with reference to the accompanying drawings.

First Embodiment

Figure 1:
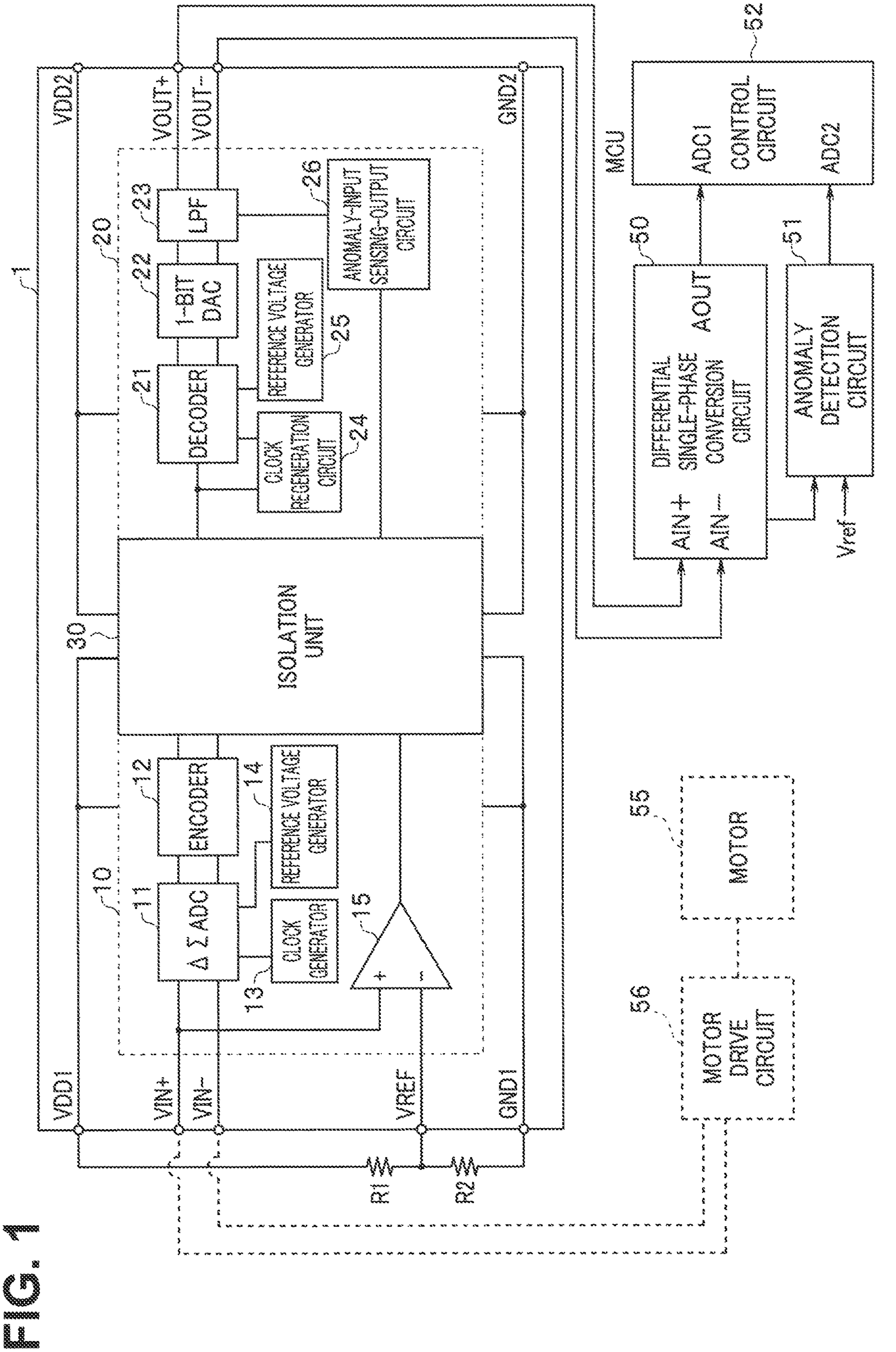
FIG. 1 is a block diagram illustrating a semiconductor integrated circuit according to a first embodiment of the present invention.

FIG. 1 is a block diagram illustrating a semiconductor integrated circuit according to a first embodiment of the present invention. The semiconductor integrated circuit in FIG. 1 constitutes an isolation amplifier. In the present embodiment, a usual data transmission path of the isolation amplifier is used, and output data is changed in accordance with anomaly occurrence, thereby achieving high-speed conveyance of the anomaly occurrence.

Note that, in FIG. 1, a motor 55 or a motor drive circuit 56 configured to drive the motor 55 is assumed as a detection target, and description is made on an example in which anomaly of voltage and current generated at the motor 55 or the motor drive circuit 56 is detected, but the detection target is not limited to the motor 55 nor the motor drive circuit 56. The present embodiment is also applicable to a case in which, for example, the detection target is an electric generator and electric power anomaly of a sensor with respect to vibration and heat that occurs to the electric generator is detected.

In FIG. 1, an isolation amplifier 1 includes a primary circuit 10, a secondary circuit 20, and an isolation unit 30. The primary circuit 10 outputs, to the isolation unit 30, a digital value in accordance with, for example, voltage or current generated at a detection target such as a motor. The isolation unit 30 conveys an output from the primary circuit 10 to the secondary circuit 20 while electrically insulating the primary circuit 10 and the secondary circuit 20 from each other. The secondary circuit 20 receives the digital value conveyed through the isolation unit 30 and restores a value of voltage or current generated at the detection target. Note that an output from the isolation amplifier 1 is supplied to a control circuit 52 formed with an MCU (micro controller unit) or the like through a differential single-phase conversion circuit 50 and an anomaly detection circuit 51 so that the control circuit 52 can determine a state of the detection target.

The primary circuit 10 includes, for example, a ΔΣ ADC 11, an encoder 12, a clock generator 13, a reference voltage generator 14, and a comparator 15. Independent power sources are supplied to the primary circuit 10 and the secondary circuit 20. In FIG. 1, power voltage VDD1 and ground voltage GND1 are supplied to the primary circuit 10, and power voltage VDD2 and ground voltage GND2 are supplied to the secondary circuit 20.

Signals corresponding to, for example, values of voltage or current generated at the detection target are input as differential inputs VIN by a pair of input differential signals VIN+ and VIN− to the primary circuit 10. The input differential signals VIN+ and VIN− are provided to the ΔΣ ADC 11. The clock generator 13 generates a clock and provides the clock to the ΔΣ ADC 11. The reference voltage generator 14 generates reference voltage and provides the reference voltage to the ΔΣ ADC 11. The ΔΣ ADC 11 converts, by using the reference voltage from the reference voltage generator 14, the input differential signals VIN+ and VIN− into digital signals in synchronization with a clock signal generated by the clock generator 13, and outputs the digital signals to the encoder 12. The encoder 12 encodes the digital signals converted by the ΔΣ ADC 11 and outputs the encoded digital signals to the isolation unit 30.

Resistors R1 and R2 are connected in series between a power source line through which the power voltage VDD1 is supplied and a ground line through which the ground voltage GND2 is supplied. Voltage appearing at a connection point between the resistors R1 and R2 is supplied as detection voltage VREF to a negative-polarity input end of the comparator 15. The input differential signal VIN+ is supplied to a positive-polarity input end of the comparator 15. The comparator 15 outputs a high-level (H-level) detection signal when the input differential signal VIN+ exceeds the detection voltage VREF. The comparator 15 can be configured to output the H-level detection signal when the input differential signal VIN+ is excessive input by setting resistance values of the resistors R1 and R2 as appropriate. In other words, the detection signal from the comparator 15 indicates whether anomaly such as excessive input has occurred to the differential inputs VW when the input differential signals VIN+ and VIN− are fixed to ground voltage or the like. The comparator 15 outputs the detection signal to the isolation unit 30.

Note that, in the following description, the H-level detection signal is generated when anomaly occurrence is detected and a low-level (L-level) detection signal is generated when no anomaly occurrence is detected, but the L-level detection signal may be used to indicate detection of anomaly occurrence and the H-level detection signal may be used to indicate a normal (usual) state.

Figure 2:
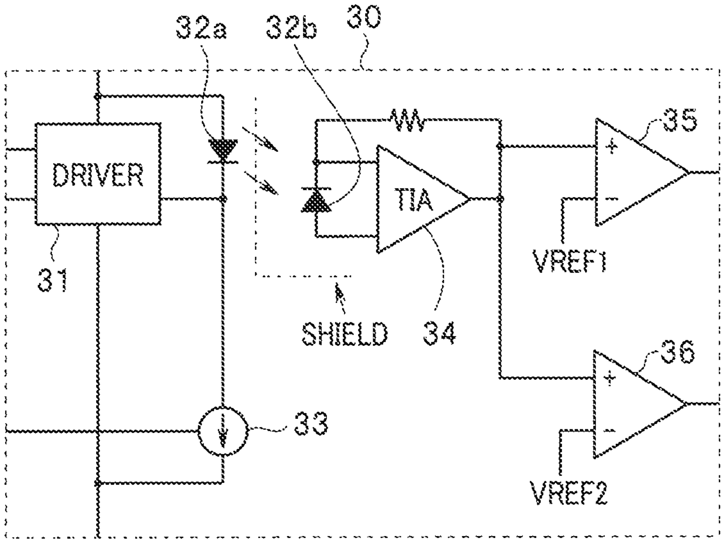
FIG. 2 is a block diagram illustrating an exemplary specific configuration of an isolation unit 30.
Figure 3:
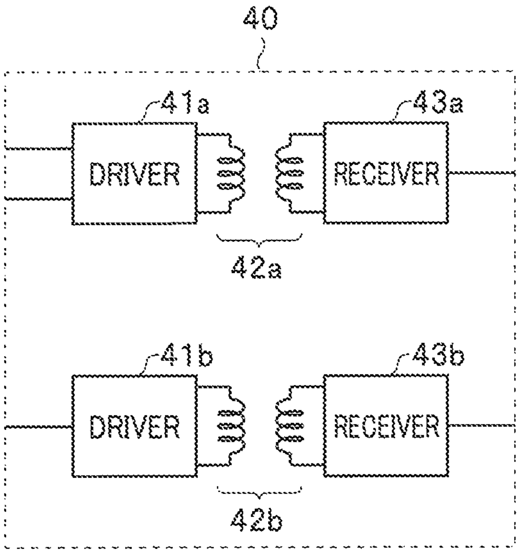
FIG. 3 is a block diagram illustrating an exemplary specific configuration of the isolation unit 30.
Figure 4:
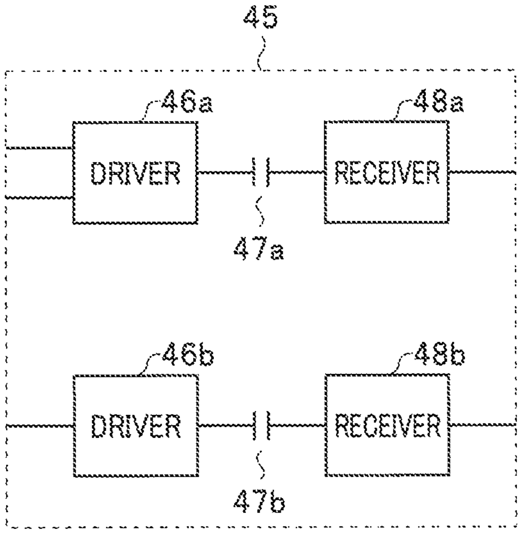
FIG. 4 is a block diagram illustrating an exemplary specific configuration of the isolation unit 30.

FIGS. 2 to 4 are each a block diagram illustrating an exemplary specific configuration of the isolation unit 30. FIG. 2 illustrates an optical coupling scheme, FIG. 3 illustrates a magnetic coupling scheme, and FIG. 4 illustrates a capacitive coupling scheme.

In FIG. 2, the digital signals from the encoder 12 are provided to a driver 31. A light emission element 32*a* and a current source 33 are connected in series between the power source line and the ground line. The driver 31 drives the light emission element 32*a* with the input digital signals. Accordingly, the light emission element 32*a* is driven by the driver 31, allows current to flow, and generates light of an emission amount in accordance with the flowing current.

The detection signal from the comparator 15 is provided to the current source 33. The current source 33 supplies a predetermined amount of current to the light emission element 32*a* in accordance with the H-level detection signal. The amount of current supplied by the current source 33 is set to be larger than an amount of current generated at the light emission element 32*a* being driven by the driver 31.

The light from the light emission element 32*a* is received by a light detection element 32*b*. The light emission element 32*a* and the light detection element 32*b* are electrically insulated from each other. The light detection element 32*b* generates current in accordance with the emission amount of light from the light emission element 32*a*. A transimpedance amplifier (TIA) 34 converts the current generated by the light detection element 32*b* into voltage. The voltage output from the transimpedance amplifier 34 is supplied to positive-polarity input ends of comparators 35 and 36.

The comparator 35 compares the output voltage from the transimpedance amplifier 34 with reference voltage VREF1 supplied to a negative-polarity input end of the comparator 35, and outputs an H-level digital signal when the output voltage from the transimpedance amplifier 34 is higher, or outputs a low-level (L-level) digital signal when the output voltage is lower. Accordingly, the output from the comparator 35 is a digital signal corresponding to the digital signals from the encoder 12.

The comparator 36 compares the output voltage from the transimpedance amplifier 34 with reference voltage VREF2 supplied to a negative-polarity input end of the comparator 36. The reference voltage VREF2 is set to be higher than the reference voltage VREF1 and higher than the voltage generated through drive by the driver 31. The comparator 36 outputs an H-level digital signal when the output voltage from the transimpedance amplifier 34 is higher than the reference voltage VREF2, or outputs an L-level digital signal when the output voltage is lower than the reference voltage VREF2. Accordingly, the output from the comparator 36 is a pulse signal corresponding to the detection signal from the comparator 15.

FIG. 3 illustrates an isolation unit 40 that is usable as the isolation unit 30. The isolation unit 40 includes drivers 41*a* and 41*b*, primary and secondary coils 42*a* and 42*b*, and receivers 43*a* and 43*b*. The driver 41*a* and the receiver 43*a* are electrically insulated from each other through the primary and secondary coils 42*a*, and the driver 41*b* and the receiver 43*b* are electrically insulated from each other through the primary and secondary coils 42*b*. Although not illustrated, each driver and the corresponding receiver may be doubly insulated from each other through two pairs of coils.

The driver 41*a* drives the primary and secondary coils 42*a* with the digital signals from the encoder 12. The receiver 43*a* takes out voltage generated by mutual induction of the primary and secondary coils 42*a*. Accordingly, the receiver 43*a* outputs a digital signal corresponding to the digital signals from the encoder 12.

The driver 41*b* drives the primary and secondary coils 42*b* with the detection signal from the comparator 15. The receiver 43*b* takes out voltage generated by mutual induction of the primary and secondary coils 42*b*. Accordingly, the receiver 43*b* outputs a pulse signal corresponding to the detection signal from the comparator 15.

FIG. 4 illustrates an isolation unit 45 that is usable as the isolation unit 30. The isolation unit 45 includes drivers 46*a* and 46*b*, coupling capacitors 47*a* and 47*b*, and receivers 48*a* and 48*b*. The driver 46*a* and the receiver 48*a* are electrically insulated from each other through the coupling capacitor 47*a*, and the driver 46*b* and the receiver 48*b* are electrically insulated from each other through the coupling capacitor 47*b*. Although not illustrated, each driver and the corresponding receiver may be doubly insulated from each other through two pairs of coupling capacitors.

The driver 46*a* applies the digital signals from the encoder 12 to the coupling capacitor 47*a*. The receiver 48*a* takes out an output from the driver 46*a* through the coupling capacitor 47*a*. Accordingly, the receiver 48*a* outputs a digital signal corresponding to the digital signals from the encoder 12.

The driver 46*b* applies the detection signal from the comparator 15 to the coupling capacitor 47*b*. The receiver 48*b* takes out an output from the driver 46*b* through the coupling capacitor 47*b*. Accordingly, the receiver 48*b* outputs a pulse signal corresponding to the detection signal from the comparator 15.

In FIG. 1, an output from the isolation unit 30 is supplied to the secondary circuit 20. The secondary circuit 20 includes a decoder 21, a 1-bit DAC 22, an LPF (low-pass filter) 23, a clock regeneration circuit 24, a reference voltage generator 25, and an anomaly-input sensing-output circuit 26.

The output (digital signal) from the isolation unit 30, which is based on the outputs from the encoder 12, is provided to the decoder 21 and the clock regeneration circuit 24. The clock regeneration circuit 24 regenerates a clock from the input digital signal and outputs the clock to the decoder 21. The reference voltage generator 25 generates reference voltage and outputs the reference voltage to the decoder 21. By using the clock from the clock regeneration circuit 24 and the reference voltage, the decoder 21 performs decoding through which the signals encoded by the encoder 12 are returned to signals before the encoding. The decoder 21 outputs the decoded digital signals to the 1-bit DAC 22.

The 1-bit DAC 22 converts the digital signals decoded by the decoder 21 into analog signals and outputs the analog signals to the LPF 23. The LPF 23 removes any unnecessary frequency component contained in the analog signals output from the 1-bit DAC 22 and outputs differential outputs VOUT by a pair of output differential signals VOUT+ and VOUT− from output terminals. The output differential signals VOUT+ and VOUT− are input as differential signals AIN+ and AIN−, respectively, to a differential single-phase conversion circuit 50. Note that an output circuit is formed by the decoder 21, the 1-bit DAC 22, and the LPF 23.

The differential single-phase conversion circuit 50 converts the differential signals AIN+ and AIN− into a single-phase output. For example, the differential single-phase conversion circuit 50 converts the differential signals AIN+ and AIN− into a single-phase output AOUT by calculating a difference between the differential signals AIN+ and AIN−, and outputs the single-phase output AOUT to an ADC1 end of the control circuit 52. In addition, the differential single-phase conversion circuit 50 adds the differential signals AIN+ and AIN− and outputs voltage as (half of) a result of the addition to an anomaly detection circuit 51.

Figure 5:
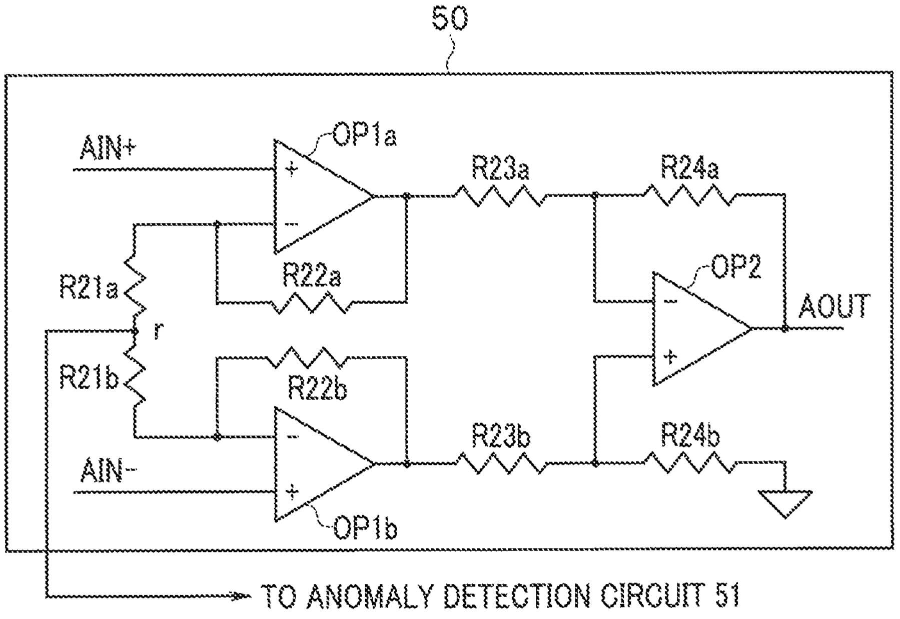
FIG. 5 is a circuit diagram illustrating an example of a specific configuration of a differential single-phase conversion circuit 50 in FIG. 1.

FIG. 5 is a circuit diagram illustrating an example of a specific configuration of the differential single-phase conversion circuit 50 in FIG. 1.

The differential signal AIN+ is supplied to a non-inverting input end of an operational amplifier OP1*a*. An inverting input end of the operational amplifier OP1*a* is connected with an output end of the operational amplifier OP1*a* through a resistor R22*a* and also connected with a node r through a resistor R21*a*. A non-inverting amplifier is formed by the operational amplifier OP1*a* and the resistors R21*a* and R22*a*.

The differential signal AIN− is supplied to a non-inverting input end of an operational amplifier OP1*b*. An inverting input end of the operational amplifier OP1*b* is connected with an output end of the operational amplifier OP1*b* through a resistor R22*b* and also connected with the node r through a resistor R21*b*. A non-inverting amplifier is formed by the operational amplifier OP1*b* and the resistors R21*b* and R22*b*.

The output end of the operational amplifier OP1*a* is connected with an inverting input end of an operational amplifier OP2 through a resistor R23*a*, and the output end of the operational amplifier OP1*b* is connected with a non-inverting input end of the operational amplifier OP2 through a resistor R23*b*. The inverting input end of the operational amplifier OP2 is connected with an output end of the operational amplifier OP2 through a resistor R24*a*, and the non-the inverting input end of the operational amplifier OP2 is connected with a reference potential point through a resistor R24*b*. A differential amplifier is formed by the operational amplifier OP2 and the resistors R23*a*, R23*b*, R24*a*, and R24*b*.

The differential signal AIN+ is amplified by the non-inverting amplifier formed by the operational amplifier OP1*a* and is then provided to the inverting input end of the operational amplifier OP2 forming the differential amplifier. The differential signal AIN− is amplified by the non-inverting amplifier formed by the operational amplifier OP1*b* and is then provided to the non-inverting input end of the operational amplifier OP2. The differential signals AIN+ and AIN− are differentially amplified by the operational amplifier OP2, and the single-phase output AOUT in accordance with the difference between the differential signals AIN+ and AIN− is obtained from the output end of the operational amplifier OP2. The single-phase output AOUT is supplied to the ADC1 end of the control circuit 52.

The voltage of the differential signal AIN+ appearing at the inverting input end of the operational amplifier OP1*a* and the voltage of the differential signal AIN− appearing at the inverting input end of the operational amplifier OP1*b* are divided by the resistors R21*a* and R21*b*. When resistance values of the resistors R21*a* and R21*b* are set to be equal to each other, voltage that is equal to half of the addition result of the differential signals AIN+ and AIN− appears at the node r. This voltage is supplied to the anomaly detection circuit 51.

In FIG. 1, the anomaly detection circuit 51 may be formed with, for example, a comparator. Determination reference voltage Vref is provided to the anomaly detection circuit 51. The anomaly detection circuit 51 outputs, to an ADC2 end of the control circuit 52, an anomaly detection result indicating whether anomaly such as excessive input has occurred through comparison between the determination reference voltage Vref and voltage based on the addition result from the differential single-phase conversion circuit 50.

The control circuit 52 is formed with, for example, an MCU. The control circuit 52 obtains, for example, values of voltage or current generated at the detection target based on the single-phase output AOUT input to the ADC1 end. In addition, the control circuit 52 determines anomaly such as excessive input having occurred to the detection target based on the anomaly detection result input to the ADC2 end.

The isolation amplifier 1 performs processing that converts a signal transmitted in the primary circuit 10 into a digital signal and converts a digital signal transmitted in the secondary circuit 20 back into an analog signal, and needs filtering through the LPF 23 after the D/A conversion. However, a certain delay time that is relatively long is inherently generated in the filtering through the LPF 23. A relatively long time is needed until the control circuit 52 recognizes a state of anomaly such as excessive input because of the signal delay through the LPF 23.

Thus, the anomaly-input sensing-output circuit 26 is provided in the present embodiment. When provided with the H-level detection signal indicating occurrence of the state of anomaly such as excessive input, the anomaly-input sensing-output circuit 26 changes the output from the LPF 23 at a timing of the detection signal so that occurrence of excessive input or the like can be conveyed to the control circuit 52 in a short time.

(Anomaly-Input Sensing-Output Circuit)

Figure 6:
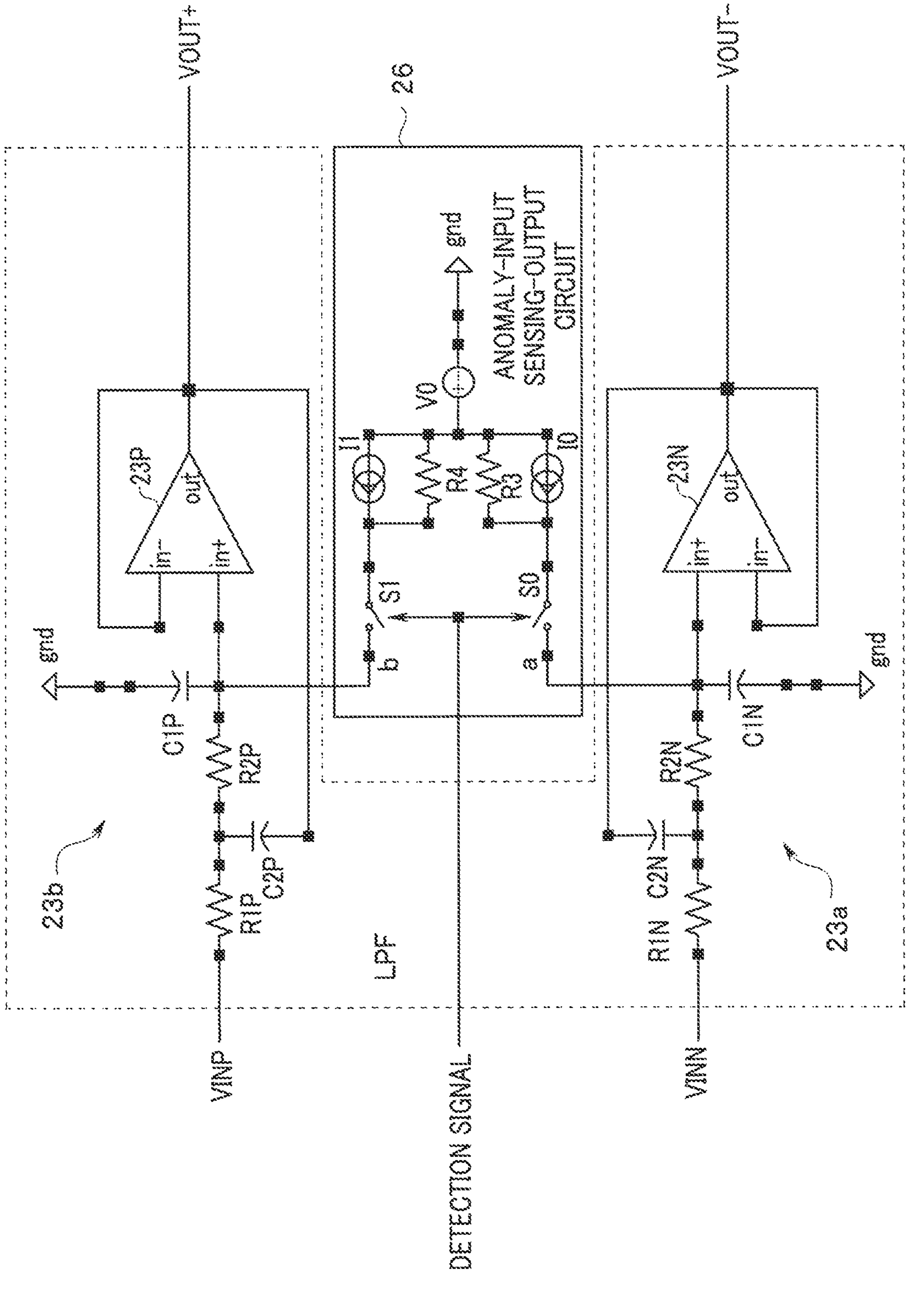
FIG. 6 is a circuit diagram illustrating an example of specific configurations of an LPF 23 and an anomaly-input sensing-output circuit 26.

FIG. 6 is a circuit diagram illustrating an example of specific configurations of the LPF 23 and the anomaly-input sensing-output circuit 26.

The LPF 23 includes an LPF unit 23*b* configured to filter a positive-polarity input VINP from the 1-bit DAC 22, and an LPF unit 23*a* configured to filter a negative-polarity input VINN from the 1-bit DAC 22. The LPF unit 23*b* is a secondary active filter formed by resistors R1P and R2P, capacitors C1P and C2P, and an operational amplifier 23P. The LPF unit 23*a* is a secondary active filter formed by resistors R1N and R2N, capacitors C1N and C2N, and an operational amplifier 23N.

The positive-polarity input VINP is input to a non-inverting input end in+ of the operational amplifier 23P through the resistors R1P and R2P. The non-inverting input end in+ of the operational amplifier 23P is connected with the ground line (gnd) through the capacitor C1P, and an output end of the operational amplifier 23P is connected with an inverting input end in− of the operational amplifier 23P and also connected with a connection point between the resistors R1P and R2P through the capacitor C2P. The LPF unit 23*b* band-limits a high-frequency component of the positive-polarity input VINP, and then outputs the output differential signal VOUT+.

The negative-polarity input VINN is input to a non-inverting input end in+ of the operational amplifier 23N through the resistors R1N and R2N. The non-inverting input end in+ of the operational amplifier 23N is connected with the ground line (gnd) through the capacitor C1N, and an output end of the operational amplifier 23N is connected with an inverting input end in− of the operational amplifier 23N and also connected with a connection point between the resistors R1N and R2N through the capacitor C2N. The LPF unit 23*a* band-limits a high-frequency component of the negative-polarity input VINN, and then outputs the output differential signal VOUT−.

In the present embodiment, the non-inverting input end in+ of the operational amplifier 23P is connected with a node "b" of the anomaly-input sensing-output circuit 26, and the non-inverting input end in+ of the operational amplifier 23N is connected with a node "a" of the anomaly-input sensing-output circuit 26. The anomaly-input sensing-output circuit 26 includes a constant voltage generation circuit V0, current sources I0 and I1, resistors R3 and R4, and switches S0 and S1.

A negative-polarity terminal of the constant voltage generation circuit V0 is connected with the ground line (gnd), and a positive-polarity terminal of the constant voltage generation circuit V0 is connected with the node "a" through the current source I0 and the switch S0. The resistor R3 is connected in parallel with a current path of the current source I0. The positive-polarity terminal of the constant voltage generation circuit V0 is also connected with the node "b" through the current source I1 and the switch S1. The resistor R4 is connected in parallel with a current path of the current source I1.

The anomaly-input sensing-output circuit 26 receives the detection signal from the isolation unit 30 and controls the switches S0 and S1 to be on and off in accordance with the detection signal. In other words, the switches S0 and S1 are both off when the detection signal is at the L level, which indicates no sensing of excessive input or the like, and the switches S0 and S1 are both on when the detection signal is at the H level, which indicates sensing of excessive input or the like.

When the switch S0 is on, voltage Vcm1 determined by voltage generated by the constant voltage generation circuit V0, current generated by the current source 10, and a resistance value of the resistor R3 is applied to the node "a". Voltage of the non-inverting input end in+ of the operational amplifier 23N is set by the voltage Vcm1, and an in-phase level of the output differential signal VOUT− becomes Vcm1.

Similarly, when the switch S1 is on, voltage Vcm2 determined by the voltage generated by the constant voltage generation circuit V0, current generated by the current source I1, and a resistance value of the resistor R4 is applied to the node "b". Voltage of the non-inverting input end in+ of the operational amplifier 23P is set by the voltage Vcm2, and an in-phase level of the output differential signal VOUT+ becomes Vcm2. Note that the following description assumes Vcm1=Vcm2=Vcm.

The detection signal from the comparator 15 becomes the H level right after the input differential signal VIN+ or the differential input VIN becomes excessive input, and the nodes "a" and "b" of the anomaly-input sensing-output circuit 26 change to voltage Vcm right after the input differential signal VIN+ or the differential input VIN becomes excessive input. Thus, the in-phase levels of the output differential signals VOUT+ and VOUT− from the LPF 23 become Vcm through level shift right after the input differential signal VIN+ or differential input VIN becomes excessive input before the output differential signals VOUT+ and VOUT− in accordance with excessive input of the input differential signals VIN+ and VIN− are output from the LPF 23. In other words, the in-phase level that was at a predetermined level (for example, 0V) in a normal state changes to Vcm.

In a normal state in which no state of anomaly such as excessive input occurs to the output differential signals VOUT+ and VOUT−, a sum of the output differential signals VOUT+ and VOUT− is at a certain level. However, when the state of anomaly such as excessive input occurs to the output differential signals VOUT+ and VOUT−, the sum of the output differential signals VOUT+ and VOUT− is at a level corresponding to the voltage Vcm. Thus, the state of anomaly such as excessive input can be determined based on a result of addition of the output differential signals VOUT+ and VOUT−.

(Effects)

Figure 7:
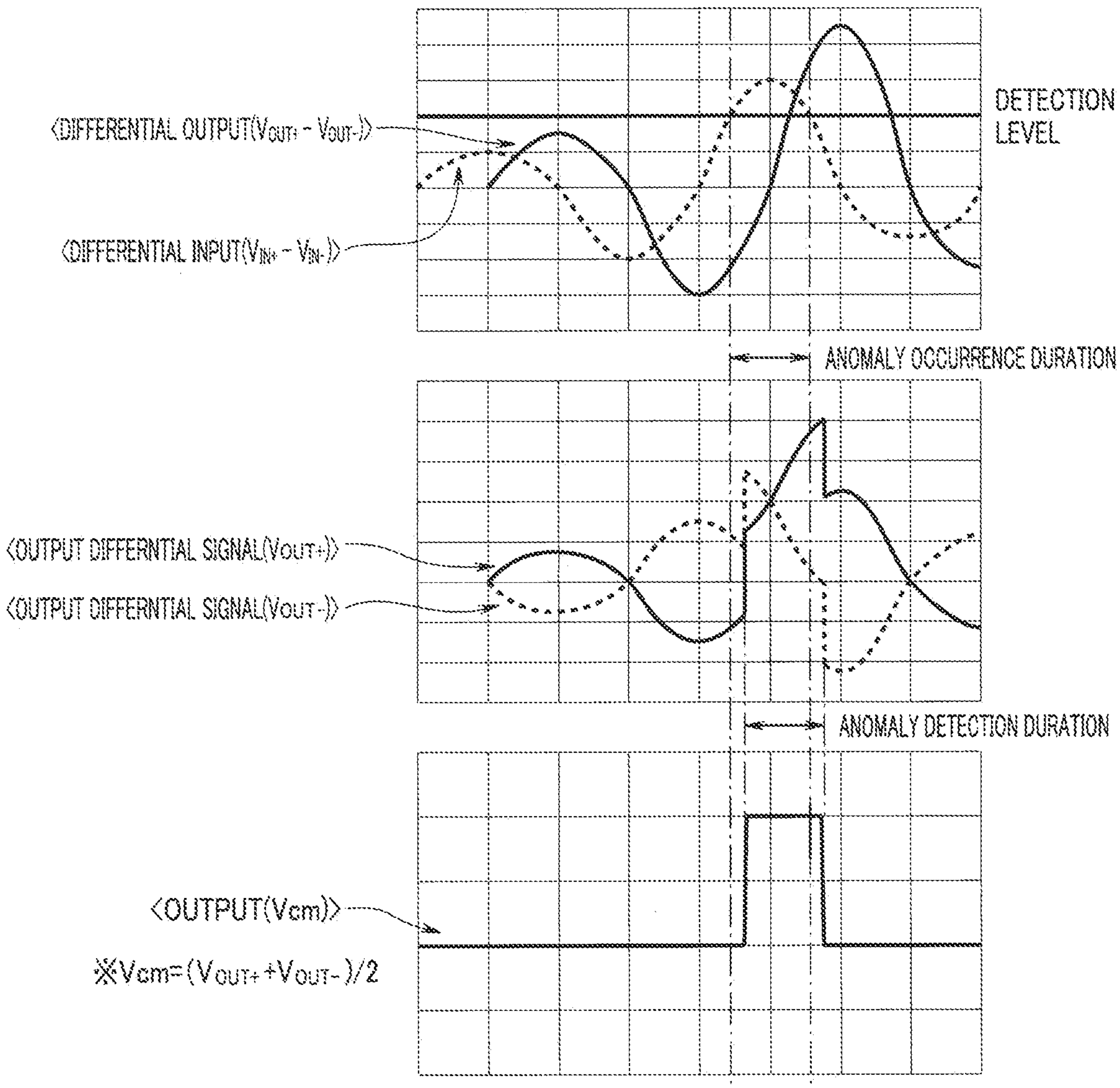
FIG. 7 illustrates input and output waveforms with a horizontal axis representing time and a vertical axis representing voltage.

Subsequently, operation of the embodiment thus configured will be described below with reference to a waveform diagram in FIG. 7. FIG. 7 illustrates input and output waveforms with a horizontal axis representing time and a vertical axis representing voltage. In an upper part of FIG. 7, a dashed line illustrates differential input VIN that is difference voltage between the input differential signals VIN+ and VIN−, and a solid line illustrates differential output VOUT that is difference voltage between the output differential signals VOUT+ and VOUT−. In a middle part of FIG. 7, a solid line illustrates the output differential signal VOUT+, and a dashed line illustrates the output differential signal VOUT−. In a lower part of FIG. 7, a result of anomaly detection at the control circuit is illustrated.

Assume that the differential input VIN illustrated with a dashed line in the upper part of FIG. 7 is input. Hereinafter, the descriptions will be made assuming that the input differential signal VIN− is fixed to the ground voltage. A detection level in the upper part of FIG. 7 indicates a determination level of excessive input, and it is determined that there is excessive input when the difference voltage VIN between the input differential signal VIN+ and the input differential signal VIN− is higher than the detection level. In other words, a duration in which the differential inputs VIN are higher than the detection level is an anomaly occurrence duration. Note that the detection voltage VREF corresponding to the detection level in FIG. 7 is set by the power voltage VDD1 and the resistors R1 and R2.

The input differential signals VIN+ and VIN− input to the primary circuit 10 are converted into digital signals by the ΔΣ ADC 11, encoded by the encoder 12, and then supplied to the isolation unit 30. The isolation unit 30 conveys the outputs from the encoder 12 to the secondary circuit 20. The decoder 21 of the secondary circuit 20 decodes the input signals and provides the decoded signals to the 1-bit DAC 22. The 1-bit DAC 22 converts the outputs from the decoder 21 back into analog signals and outputs the analog signals to the LPF 23. The LPF 23 outputs the differential outputs VOUT corresponding to the differential inputs VIN by filtering high-frequency components of the outputs from the 1-bit DAC 22.

Delay occurs with the filtering through the LPF 23. As a result, the differential outputs VOUT are output at a relatively long time delay relative to the differential inputs VIN as illustrated in the upper part of FIG. 7.

Assume that the differential inputs VIN become the state of excessive input (anomaly occurrence duration) in which the differential inputs VIN exceed the detection level in the upper part of FIG. 7. The comparator 15 outputs the H-level detection signal in a relatively short time after occurrence of the excessive input. A duration of the H-level detection signal is an anomaly detection duration of the primary circuit 10. The detection signal is supplied to the anomaly-input sensing-output circuit 26 through the isolation unit 30 and turns on the switches S0 and S1. As a result, the voltage Vcm is applied to the nodes "a" and "b" of the anomaly-input sensing-output circuit 26 and in-phase outputs from the LPF units 23*a* and 23*b* become the voltage Vcm.

The middle part of FIG. 7 illustrates this state, and the in-phase levels of the output differential signals VOUT+ and VOUT− each increase by the voltage Vcm. The detection signal from the comparator 15 becomes the L level right after the excessive input of the differential inputs VIN is solved and the differential inputs VIN become lower than the detection level in the upper part of FIG. 7. The detection signal is supplied to the anomaly-input sensing-output circuit 26 through the isolation unit 30 and turns off the switches S0 and S1. As a result, the in-phase outputs from the LPF units 23*a* and 23*b* each return to in-phase voltage in the normal state.

The output differential signals VOUT+ and VOUT− from the LPF 23 are supplied to the differential single-phase conversion circuit 50 at a later stage. The differential single-phase conversion circuit 50 obtains an output corresponding to the differential input VIN based on calculation of a difference between the output differential signals VOUT+ and VOUT−, and outputs the output to the control circuit 52. Accordingly, the control circuit 52 can determine, for example, voltage or current of the detection target based on the differential outputs VOUT.

In addition, the differential single-phase conversion circuit 50 calculates the sum of the output differential signal VOUT+ and the output differential signal VOUT− and outputs the sum to the anomaly detection circuit 51. The anomaly detection circuit 51 compares the determination reference voltage Vref and voltage based on the addition result from the differential single-phase conversion circuit 50, and outputs a result of the comparison. As illustrated in the lower part of FIG. 7, in a normal state, half of a sum voltage of the output differential signal VOUT+ and the output differential signal VOUT− is a certain voltage (voltage that corresponds to the in-phase voltage in the normal state). In an anomaly state, half of the sum voltage of the output differential signal VOUT+ and the output differential signal VOUT− is the voltage Vcm. In other words, a pulse waveform in the lower part of FIG. 7 is a result of detection by the anomaly detection circuit 51, which indicates a duration (the anomaly detection duration) of the state of anomaly such as excessive input. The anomaly detection circuit 51 outputs the result of anomaly detection to the ADC2 end of the control circuit 52. The pulse waveform in the lower part of FIG. 7 indicates the anomaly detection duration slightly delayed from the anomaly occurrence duration, and the isolation amplifier 1 can perform high-speed conveyance of anomaly occurrence detected by the primary circuit 10.

The output differential signal VOUT+ and the output differential signal VOUT− in the anomaly detection duration include known voltage added by the anomaly-input sensing-output circuit 26. Thus, in the anomaly detection duration as well, the difference between the output differential signal VOUT+ and the output differential signal VOUT− corresponds to the differential inputs VIN as illustrated in the upper part of FIG. 7. Accordingly, in the present embodiment, a duration of anomaly such as excessive input can be detected based on the output differential signals VOUT+ and VOUT− from the LPF 23, and for example, voltage or current of the detection target can be determined in the entire duration including the anomaly duration.

In this manner, in the present embodiment, anomaly of the differential inputs VIN is sensed on a primary side, and a detection signal is transmitted to a secondary side. On the secondary side, the in-phase levels of the output differential signals VOUT+ and VOUT− from the LPF are shifted based on the detection signal in the anomaly detection duration. Accordingly, without influence of processing delay at the LPF, it is possible to perform high-speed conveyance of anomaly occurrence to the control circuit 52 at a later stage based on the outputs from the LPF.

(Modification)

Figure 8:
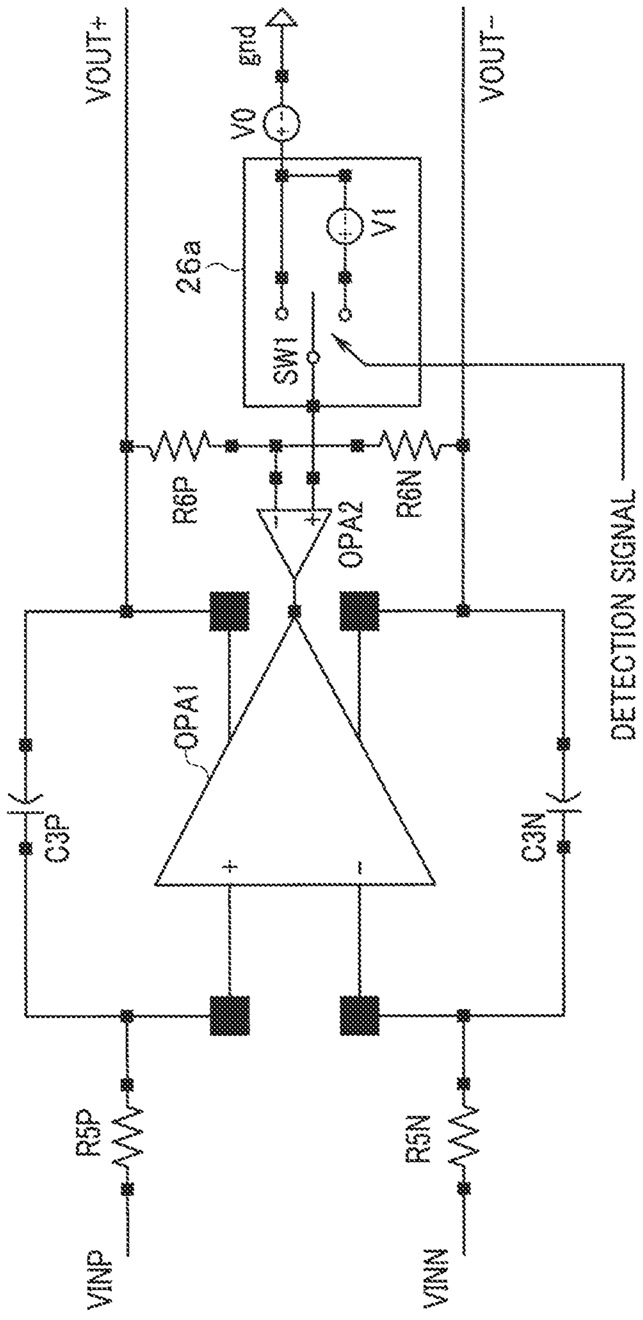
FIG. 8 is a circuit diagram illustrating a modification.

FIG. 8 is a circuit diagram illustrating a modification. FIG. 8 illustrates another example of the configurations of the LPF 23 and the anomaly-input sensing-output circuit 26. The present modification describes an exemplary configuration in which a fully differential circuit is used as the LPF 23.

In FIG. 8, the positive-polarity input VINP from the 1-bit DAC 22 is provided to a non-inverting input end of a fully differential amplifier OPA1 through a resistor R5P. The negative-polarity input VINN from the 1-bit DAC 22 is provided to an inverting input end of the fully differential amplifier OPA1 through a resistor R5N. A capacitor C3P is connected between a positive-polarity output end of the fully differential amplifier OPA1 and the non-inverting input end of the fully differential amplifier OPA1, and a capacitor C3N is connected between a negative-polarity output end of the fully differential amplifier OPA1 and the inverting input end of the fully differential amplifier OPA1. The LPF 23 is formed by the fully differential amplifier OPA1, the resistors R5P and R5N, and the capacitors C3P and C3N.

The positive-polarity input VINP and the negative-polarity input VINN are filtered by the fully differential amplifier OPA1, the output differential signal VOUT+ is output from the positive-polarity output end of the fully differential amplifier OPA1, and the output differential signal VOUT− is output from the negative-polarity output end of the fully differential amplifier OPA1.

Resistors R6P and R6N are connected in series between the positive-polarity output end and negative-polarity output end of the fully differential amplifier OPA1, and a connection point between the resistors R6P and R6N is connected with an inverting input end of an operational amplifier OPA2. Voltage generated by a voltage generation circuit **26*a* is supplied to a non-inverting input end of the operational amplifier OPA2. The operational amplifier OPA2 supplies voltage based on difference voltage between two inputs to the fully differential amplifier OPA1. Operation is performed so that in-phase voltage of the fully differential amplifier OPA1 matches output voltage from the operational amplifier OPA2**.

The negative-polarity terminal of the constant voltage generation circuit V0 is connected with the ground line (gnd), and the positive-polarity terminal of the constant voltage generation circuit V0 is connected with one terminal of a switch SW1. A constant voltage generation circuit V1 has a negative-polarity terminal connected with the positive-polarity terminal of the constant voltage generation circuit V0 and has a positive-polarity terminal connected with the other terminal of the switch SW1. The constant voltage generation circuits V0 and V1 generate voltages V0 and V1, respectively.

The switch SW1 has a common terminal connected with the non-inverting input end of the operational amplifier OPA2. The switch SW1 is controlled by a detection signal from the isolation unit 30. The switch SW1 provides the voltage V0 generated by the constant voltage generation circuit V0 to the non-inverting input end of the operational amplifier OPA2 in response to the detection signal indicating that no anomaly occurs, and the switch SW1 provides a sum voltage (V0+V1) of the voltages generated by the constant voltage generation circuits V0 and V1 to the non-inverting input end of the operational amplifier OPA2 in response to the detection signal indicating that anomaly occurs.

The circuit in FIG. 8 is a fully differential circuit, and thus the in-phase voltage of the fully differential amplifier OPA1 is controlled by the detection signal to change the output differential signals VOUT+ and VOUT− from the LPF 23. In a normal state, the output from the operational amplifier OPA2 is fed back to the fully differential amplifier OPA1 so that voltage of the connection point between the resistors R6P and R6N matches the voltage V0.

In the normal state, the switch SW1 provides the voltage V0 generated by the constant voltage generation circuit V0 to the non-inverting input end of the operational amplifier OPA2 in response to the detection signal. Accordingly, the in-phase voltage of the fully differential amplifier OPA1 becomes V0. When anomaly such as excessive input occurs and the detection signal becomes the H level, the switch SW1 provides the sum voltage (V0+V1) of the voltages generated by the constant voltage generation circuits V0 and V1 to the non-inverting input end of the operational amplifier OPA2. Accordingly, the in-phase voltage of the fully differential amplifier OPA1 becomes (V0+V1), and the output differential signals VOUT+ and VOUT− are increased by V1.

Thus, when the circuit in FIG. 8 is employed, as well, it is possible to obtain effects same as effects of the first embodiment.

Second Embodiment

Figure 9:
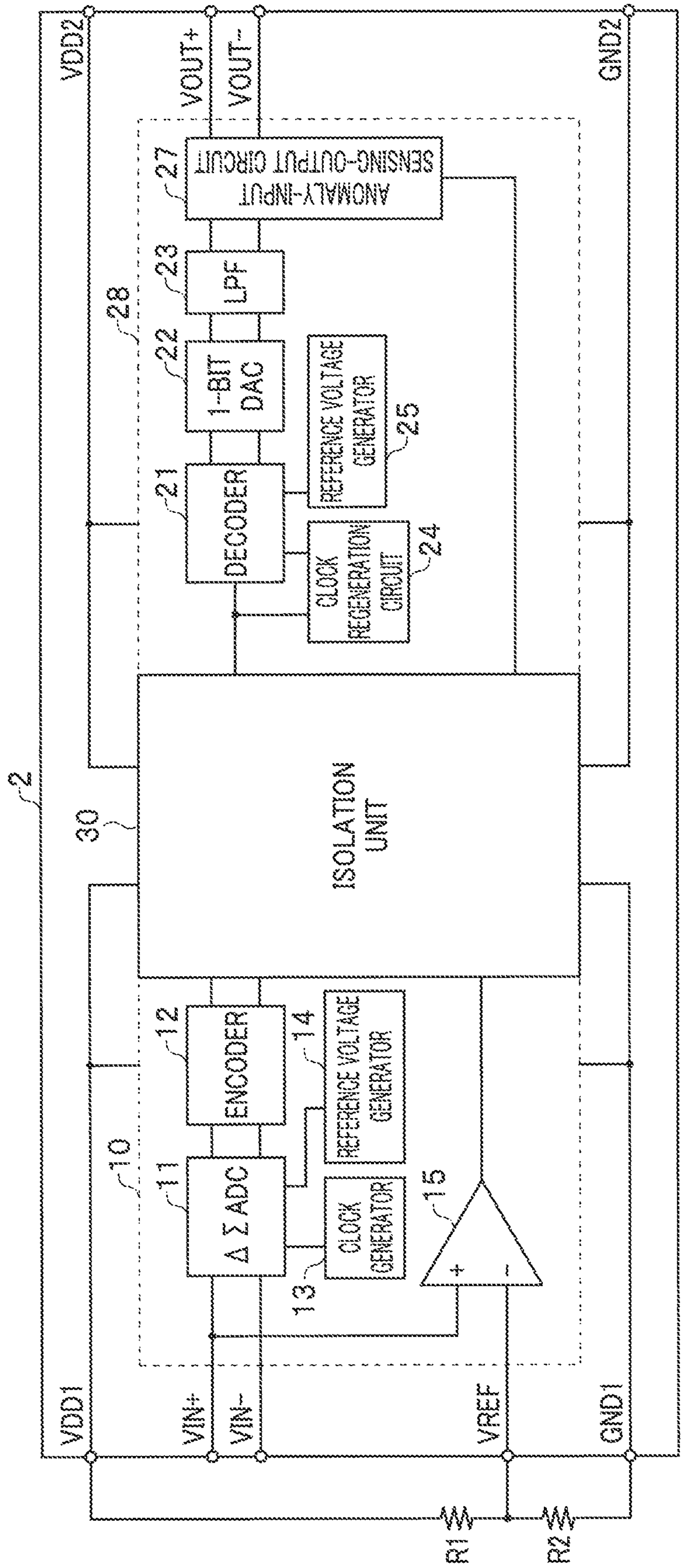
FIG. 9 is a block diagram illustrating a second embodiment of the present invention.

FIG. 9 is a block diagram illustrating a second embodiment of the present invention. In FIG. 9, any component same as a component in FIG. 1 is denoted by the same reference sign, and description of the component will be omitted.

An isolation amplifier 2 of the present embodiment performs high-speed conveyance of anomaly occurrence to the control circuit 52 at a later stage by deforming the output from the LPF 23 based on the detection signal conveyed from the primary circuit 10 to the secondary circuit 20 at a later stage of the LPF 23. Note that, in the present embodiment, illustrations of the differential single-phase conversion circuit 50 and the control circuit 52 are omitted. In the present embodiment, an operation circuit 29 is employed in place of the anomaly detection circuit 51, as illustrated in FIG. 10.

A secondary circuit 28 of the present embodiment is different from the secondary circuit 20 in FIG. 1 in that an anomaly-input sensing-output circuit 27 is employed in place of the anomaly-input sensing-output circuit 26. The anomaly-input sensing-output circuit 27 is provided with the output from the LPF 23 and outputs the output differential signals VOUT+ and VOUT−. In addition, the detection signal indicating a result of detection of anomaly such as excessive input is input from the primary circuit 10 to the anomaly-input sensing-output circuit 27 through the isolation unit 30. When the detection signal indicates anomaly occurrence, the anomaly-input sensing-output circuit 27 generates an output for notifying the anomaly occurrence in place of the differential outputs VOUT.

Figure 10:
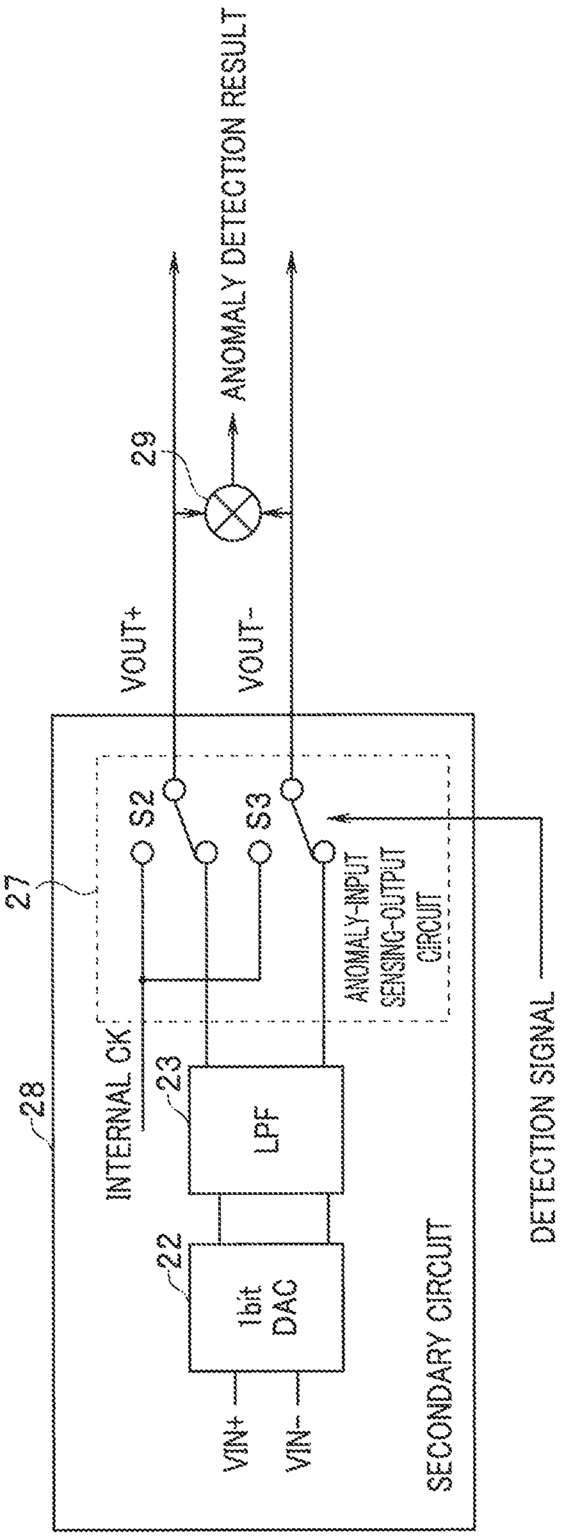
FIG. 10 is a circuit diagram illustrating an example of a specific configuration of an anomaly-input sensing-output circuit 27 in FIG. 9.

FIG. 10 is a circuit diagram illustrating an example of a specific configuration of the anomaly-input sensing-output circuit 27 in FIG. 9. FIG. 10 illustrates a partial configuration of the secondary circuit 28 in FIG. 9.

In FIG. 10, the anomaly-input sensing-output circuit 27 includes two switches S2 and S3 controlled by the detection signal. The output differential signal VOUT+ from the LPF 23 is input to one input end of the switch S2, and an internal clock (internal CK) is input to the other input end of the switch S2. The output differential signal VOUT− from the LPF 23 is input to one input end of the switch S3, and the internal clock (internal CK) is input to the other input end of the switch S3. Note that the internal CK is a regeneration clock regenerated by the clock regeneration circuit 24.

When the detection signal is at the L level, which indicates no anomaly occurrence, the switches S2 and S3 select and output the output differential signal VOUT+ or the output differential signal VOUT− from the LPF 23. When the detection signal is at the H level, which indicates anomaly occurrence, the switches S2 and S3 select and output the internal CK.

The output differential signals VOUT+ and VOUT−, which are each input to the one input end of the corresponding one of the switches S2 and S3, are differential signals, but the internal CK, which is input to the other input ends of the switches S2 and S3, is an in-phase signal. Thus, it is possible to determine which input end is selected at the switches S2 and S3 and which signal is output by providing the outputs from the anomaly-input sensing-output circuit 27 to the operation circuit 29 such as an AND circuit or an EXOR circuit in a circuit at a later stage of the secondary circuit 28.

Figure 11:
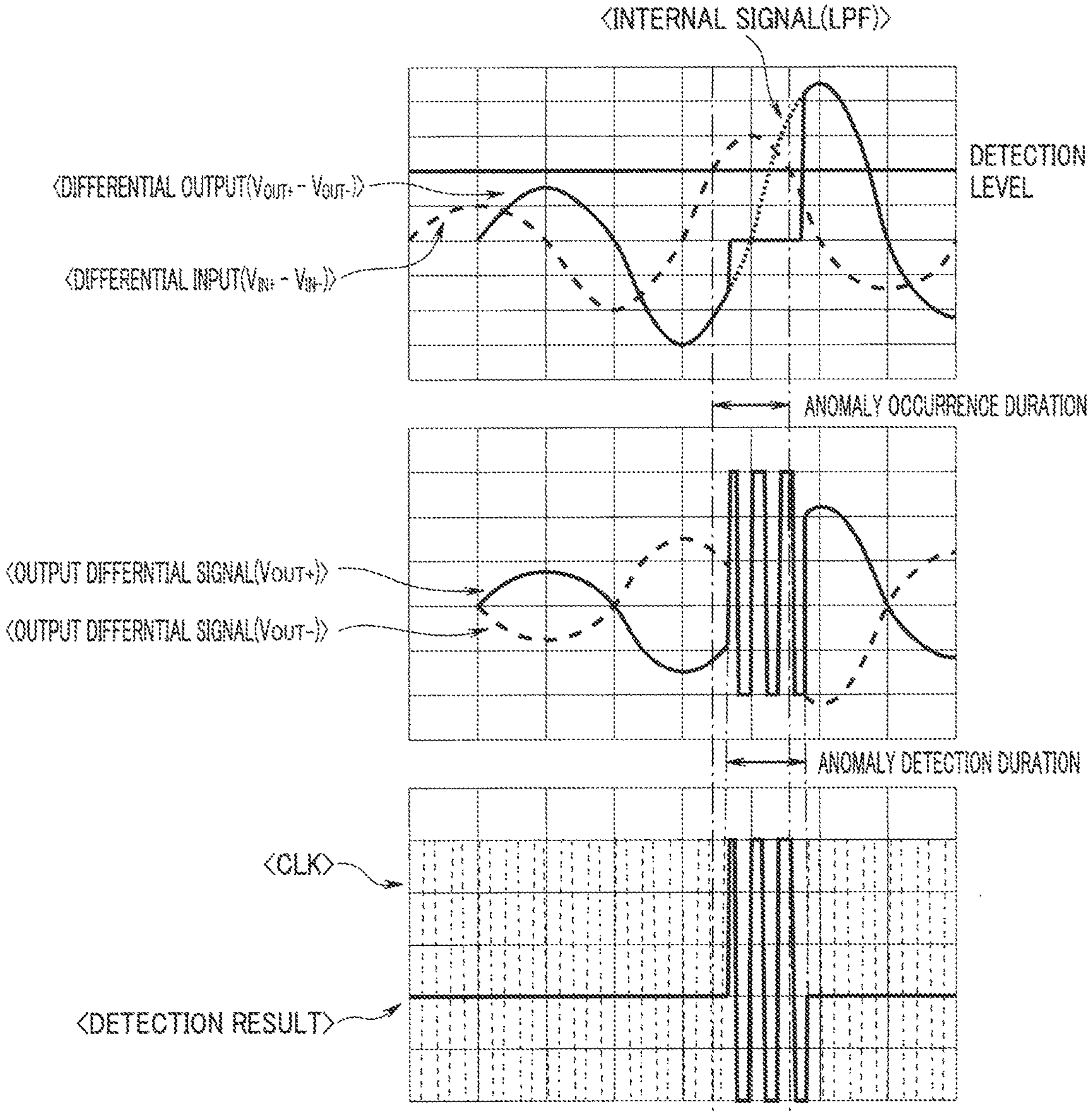
FIG. 11 illustrates input and output waveforms with a horizontal axis representing time and a vertical axis representing voltage.

Subsequently, operation of the embodiment thus configured will be described below with reference to a waveform diagram in FIG. 11. FIG. 11 illustrates input and output waveforms with a horizontal axis representing time and a vertical axis representing voltage. Similarly to FIG. 7, in an upper part of FIG. 11, a dashed line illustrates differential input VIN that is the difference voltage between the input differential signals VIN+ and VIN−, and a solid line illustrates differential output VOUT that is the difference voltage between the output differential signals VOUT+ and VOUT−, a solid line and a dashed line in a middle part illustrate the output differential signals VOUT+ and VOUT−, respectively, and the anomaly detection result input to the control circuit 52 is illustrated in a lower part.

Operation that signals (VIN+ and VIN−) in accordance with the input differential signals VIN+ and VIN− are input to the 1-bit DAC 22 and analog signals are output from the 1-bit DAC 22 is same as the operation in the first embodiment. In addition, operation that the detection signal indicating anomaly occurrence is output from the comparator 15 and conveyed to the secondary circuit 28 through the isolation unit 30 is same as the operation in the first embodiment.

In the present embodiment, the LPF 23 filters high-frequency components of input signals and outputs the filtered output differential signals VOUT+ and VOUT−. In the upper part of FIG. 11, the solid line illustrates a difference VOUT between the output differential signal VOUT+ and the output differential signal VOUT− in this case, and the dashed line illustrates a difference VIN between the input differential signal VIN+ and the input differential signal VIN−. Note that the dotted line waveform in FIG. 11, illustrated to connect with each other the curved parts of the differential output VOUT from the anomaly-input sensing-output circuit 27, is an output of the LPF 23 (<internal signal (LPF)>), and has the same waveform as the waveform of the differential output VOUT, in a duration other than the duration corresponding to the anomaly occurrence duration.

When the differential inputs VIN are not in the state of excessive input in which the differential inputs VIN exceed the detection level in the upper part of FIG. 11, the L-level detection signal is input to the anomaly-input sensing-output circuit 27. In this case, the switches S2 and S3 of the anomaly-input sensing-output circuit 27 select and output the input differential signals VOUT+ and VOUT− from the LPF 23.

Assume that the differential inputs VIN become the state of excessive input (anomaly occurrence duration) in which the differential inputs VIN exceed the detection level in the upper part of FIG. 11. The comparator 15 outputs the H-level detection signal indicating the anomaly detection duration in a relatively short time after occurrence of the excessive input. The detection signal is supplied to the anomaly-input sensing-output circuit 27 through the isolation unit 30 and causes the switches S2 and S3 to select the internal CK. As a result, the anomaly-input sensing-output circuit 27 outputs a clock CK as illustrated in the anomaly detection duration in the middle part of FIG. 11.

When the differential inputs VIN become lower than the detection level in the upper part of FIG. 11, the detection signal becomes the L level and the switches S2 and S3 directly output the output differential signals VOUT+ and VOUT− from the LPF 23 again (the middle part of FIG. 11).

As illustrated in the upper part of FIG. 11, the difference between the output differential signal VOUT+ and the output differential signal VOUT− is 0 V in the anomaly detection duration. The anomaly detection duration can be determined by calculating the output differential signals VOUT+ and VOUT−, not a mutual difference between the output differential signals. The lower part of FIG. 11 illustrates half of the sum of the output differential signal VOUT+ and the output differential signal VOUT− from the anomaly-input sensing-output circuit 27. As illustrated in FIG. 11, in the normal state, the sum voltage of the output differential signal VOUT+ and the output differential signal VOUT− is a certain voltage (in-phase voltage in the normal state). In the anomaly state, half of the sum voltage of the output differential signal VOUT+ and the output differential signal VOUT− is a pulse waveform synchronized with the internal CK. A duration of this pulse waveform is the duration (anomaly detection duration) of the state of anomaly such as excessive input. The duration of the pulse waveform in the lower part of FIG. 11 indicates the anomaly detection duration slightly delayed from the anomaly occurrence duration, and the isolation amplifier 2 can perform high-speed conveyance of anomaly occurrence detected by the primary circuit 10.

In this manner, in the present embodiment as well, similarly to the first embodiment, anomaly of the differential inputs VIN is sensed on the primary side, and the detection signal is transmitted to the secondary side. On the secondary side, the output differential signals VOUT+ and VOUT− from the LPF are converted into an in-phase signal based on the detection signal in the anomaly detection duration. Accordingly, without influence of processing delay at the LPF, it is possible to perform high-speed conveyance of anomaly occurrence to the control circuit at a later stage based on the outputs from the LPF.

Third Embodiment

Figure 12:
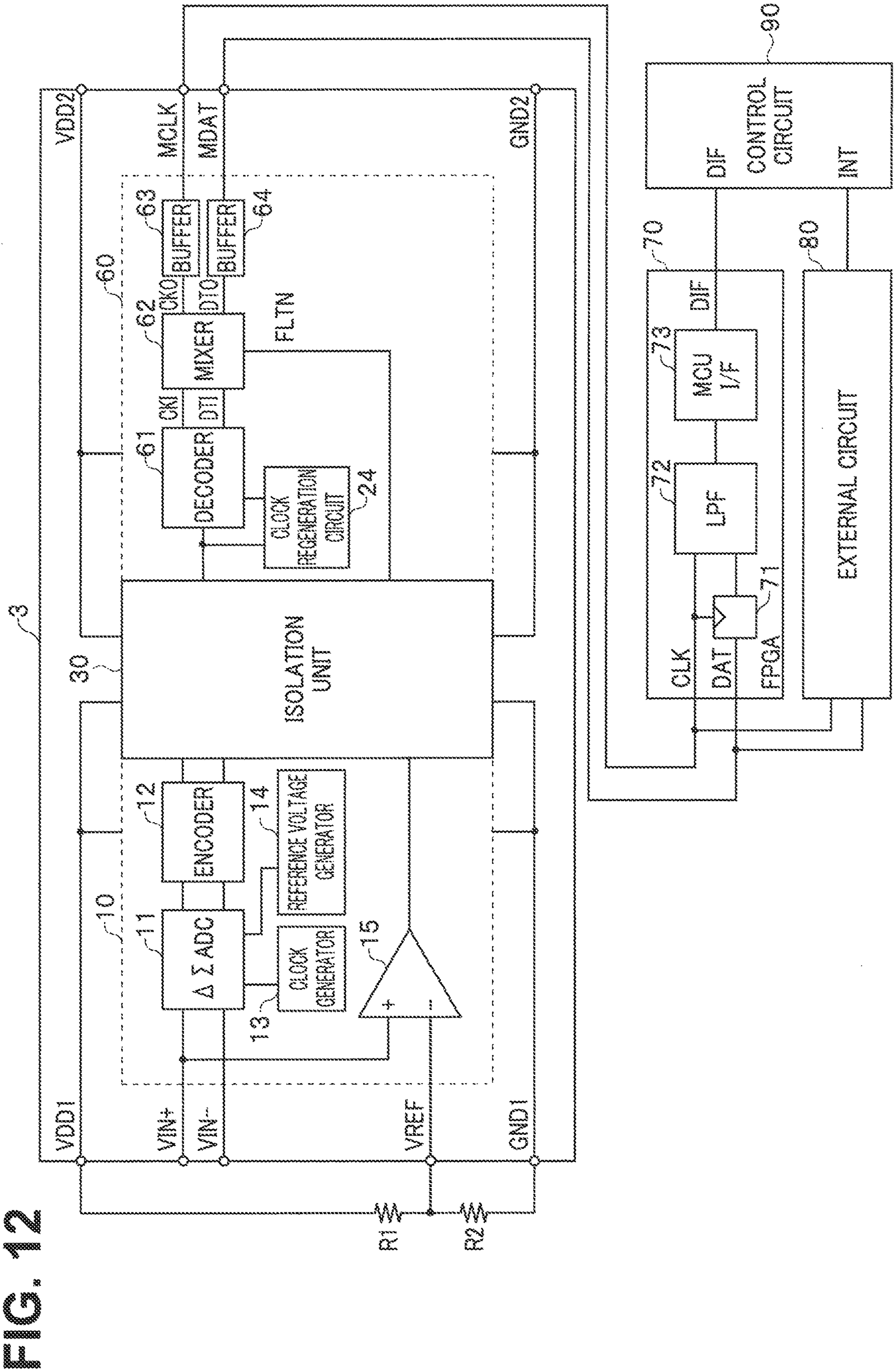
FIG. 12 is a block diagram illustrating a third embodiment of the present invention.

FIG. 12 is a block diagram illustrating a third embodiment of the present invention. In FIG. 12, any component same as a component in FIG. 1 is denoted by the same reference sign, and description of the component will be omitted.

The above-described first and second embodiments each describe an example in which the isolation amplifier outputs analog signals as the differential outputs VOUT. The present embodiment describes an example in which an isolation amplifier outputs digital data. Note that, in this case as well, low-pass filtering is needed at a circuit at a later stage of the isolation amplifier, and signal delay through a low-pass filter occurs in a usual signal transmission path.

In FIG. 12, components of the primary circuit 10 and the isolation unit 30 of an isolation amplifier 3 are same as the components in FIG. 1. In the present embodiment, a decoder 61 of a secondary circuit 60 decodes a differential signal forwarded from the isolation unit 30, generates output data DTI corresponding to the differential inputs VIN and also generates a clock CKI regenerated by the clock regeneration circuit 24.

Note that the present embodiment describes an example in which the clock CKI regenerated at the clock regeneration circuit 24 in the isolation amplifier 3 is used in data transmission, and a clock acquired from outside may be employed as the clock CKI.

In the present embodiment, the output data DTI and the clock CKI from the decoder 61 are not directly output as outputs from the isolation amplifier 3 but are provided to a mixer 62. The detection signal from the comparator 15 is provided as a detection signal FLTN through the isolation unit 30 to the mixer 62 as an anomaly-input sensing-output circuit. Note that an output circuit is formed by the decoder 61 and the mixer 62.

In the present embodiment, as described later, the mixer 62 conveys the anomaly occurrence duration to a circuit at a later stage by forcibly changing logic of the output data DTI through the H-level detection signal FLTN. The anomaly occurrence duration is determined when the forcible change is detected by the circuit at a later stage. The mixer 62 outputs output data DTO obtained by changing the output data DTI in accordance with the detection signal FLTN and directly outputs the clock CKI as a clock CKO. The clock CKO and the output data DTO are output as a clock MCLK and output data MDAT from the isolation amplifier 3 through buffers 63 and 64, respectively.

The clock MCLK and the output data MDAT from the isolation amplifier 3 are provided to an FPGA 70. The FPGA 70 includes a latch 71, an LPF 72, and an MCU interface (I/F) 73. Note that, in the following description, a latch means a D-type flip-flop in some cases. The clock MCLK is supplied to the latch 71 and the LPF 72 through a clock end CLK of the FPGA 70. The output data MDAT is input to the latch 71 through a data end DAT of the FPGA 70. The latch 71 acquires the data MDAT and outputs the data MDAT to the LPF 72 in synchronization with a rising edge of the clock MCLK. The LPF 72 performs filtering that restricts a high-frequency component of the data by using the clock MCLK, and outputs the filtered data to the MCU I/F 73. The MCU I/F 73 outputs the data from the LPF 72 to a DIF end of a control circuit 90 through an output end DIF. The control circuit 90 is configured by, for example, an MCU, acquires the output data from the LPF 72, and restores data corresponding to the differential inputs VIN.

In the present embodiment, the clock MCLK and the output data MDAT from the isolation amplifier 3 are supplied to an external circuit 80 as well. By using the clock MCLK and the output data MDAT, the external circuit 80 obtains a detection result FAULTN indicating the anomaly detection duration. The external circuit 80 outputs the detection result FAULTN to an interrupt (INT) end of the control circuit 90. The control circuit 90 determines a duration in which anomaly occurs based on the detection result FAULTN input to the INT end.

Figure 13:
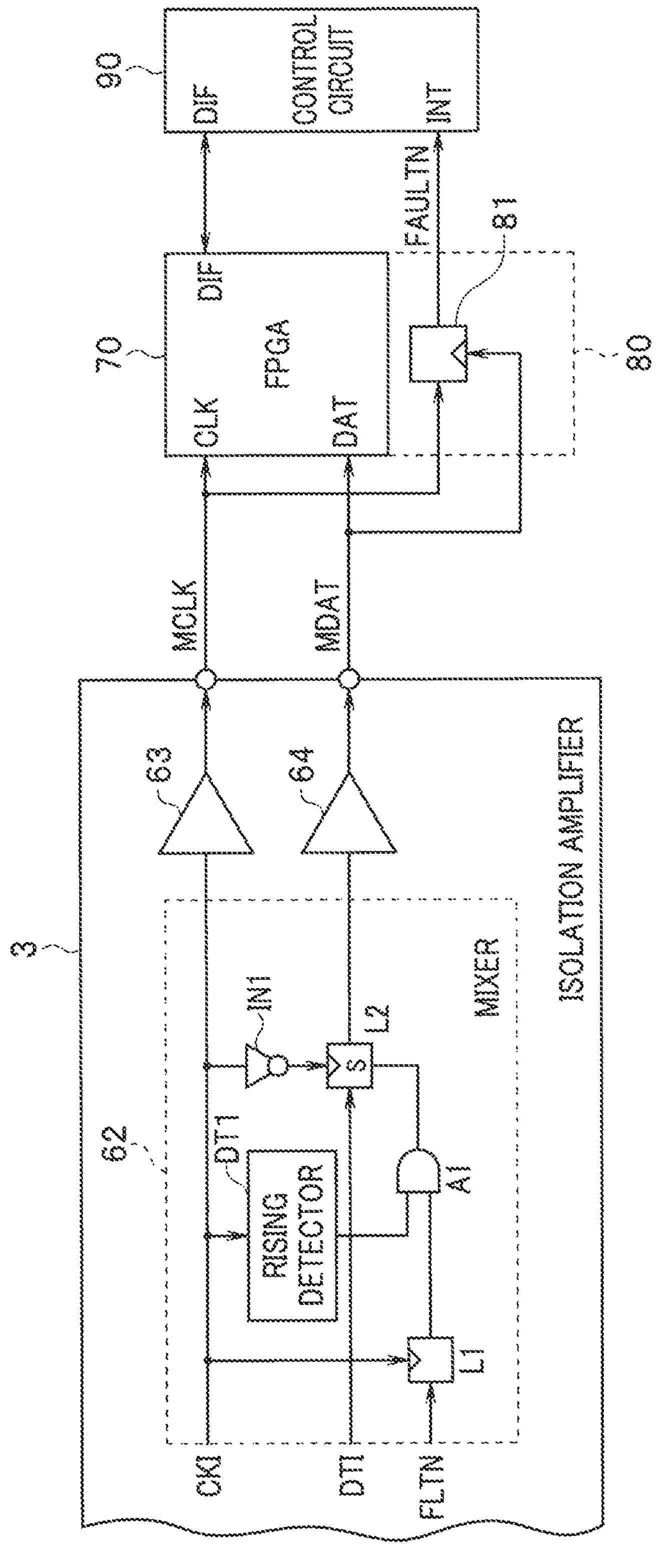
FIG. 13 is a circuit diagram illustrating an example of specific configurations of a mixer 62 and an external circuit 80 in FIG. 12.

FIG. 13 is a circuit diagram illustrating an example of specific configurations of the mixer 62 and the external circuit 80 in FIG. 12.

In FIG. 13, the mixer 62 includes a rising detector DT1, an inverter IN1, latches L1 and L2, and an AND circuit A1. The external circuit 80 includes a latch 81. The clock CKI from the decoder 61 is supplied to the latch L1, the rising detector DT1, and the inverter IN1 and also supplied to the buffer 63. The output data DTI from the decoder 61 is supplied to the latch L2. The detection signal FLTN from the isolation unit 30 is supplied to the latch L1.

The rising detector DT1 detects rising of the clock CKI and provides a rising-edge detection pulse to one input end of the AND circuit A1. The inverter IN1 inverts the clock CKI and provides the inverted clock CKI to a clock end of the latch L2. The latch L1 acquires the detection signal FLTN in response to the clock CKI and provides the detection signal FLTN to the other input end of the AND circuit A1. The AND circuit A1 provides a result of an AND operation of the two inputs to an S end of the latch L2. In a duration in which the L level is supplied to the S end, the latch L2 acquires and outputs the output data DTI at a timing of a falling edge of the clock CKI from the inverter IN1. The latch L2 outputs the H level in a duration in which the H level is supplied to the S end. The output from the latch L2 becomes the output (output data MDAT) from the isolation amplifier 3 through the buffer 64.

Since the latch L2 acquires and outputs the output data DTI at the timing of the falling edge of the clock CKI, the output data MDAT is data, logic of which changes in an L-level duration of the clock MCLK. The clock MCLK becomes the H level at a timing of rising of the clock CKI right after the detection signal FLTN changes to the H level.

The clock MCLK and the output data MDAT are supplied to a data end and a clock end, respectively, of the latch 81 of the external circuit 80. In other words, the latch 81 acquires and outputs the clock MCLK at a rising edge of the output data MDAT.

Figure 14:
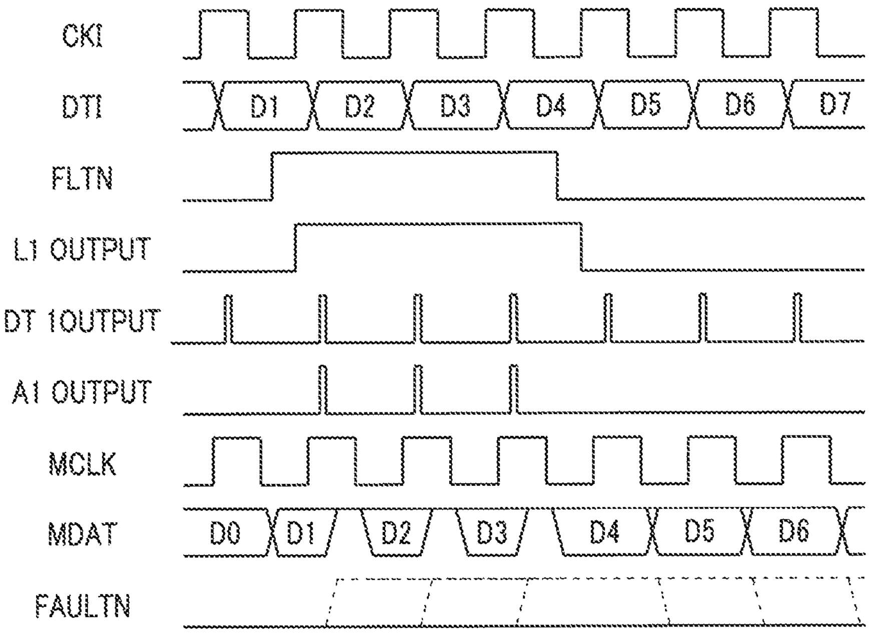
FIG. 14 is a timing chart for description of operation of the third embodiment.

Subsequently, operation of the embodiment thus configured will be described below with reference to FIG. 14. FIG. 14 is a timing chart for description of operation of the third embodiment.

The decoder 61 of the secondary circuit 60 outputs the clock CKI and also outputs the output data DTI in synchronization with the clock CKI. In FIG. 14, CKI and DTI indicate these clock and data. The clock CKI and the output data DTI are output as the clock MCLK and the output data MDAT through the mixer 62 and the buffers 63 and 64.

Assume the normal state in which no anomaly such as excessive input occurs. In this case, the detection signal FLTN is at the L level, outputs from the latch L1 and the AND circuit A1 in the mixer 62 are at the L level. Thus, the latch L2 acquires and outputs the output data DTI in synchronization with the falling edge of the clock CKI. Accordingly, the output data MDAT identical to the output data DTI is output in synchronization with the clock MCLK. Note that the output data MDAT is subjected to data switching in the L-level duration of the clock MCLK.

Subsequently, assume that anomaly such as excessive input occurs and the detection signal FLTN changes to the H level. In FIG. 14, FLTN indicates this state. In the present embodiment, for high-speed conveyance of an anomaly detection result to the control circuit 90, the mixer 62 superimposes information of the anomaly detection result on the output data MDAT. In this case, the information of the anomaly detection result is superimposed by using part of a data duration of one clock so that logic of the output data MDAT can be determined by a circuit at a later stage.

Specifically, to determine a superimposition timing, the rising detector DT1 detects a rising edge of the clock CKI and outputs the rising-edge detection pulse (DT1 output in FIG. 14). The latch L1 latches and outputs the detection signal FLTN at a timing of the clock CKI (L1 output in FIG. 14). The AND circuit A1 performs an AND operation of the rising-edge detection pulse and the output from the latch L1. In FIG. 14, A1 output indicates a result of the AND operation, and a pulse generated in synchronization with the timing of rising of the clock CKI is output from the AND circuit A1 in an H-level duration of the detection signal FLTN.

The latch L2 forcibly changes a level of the output data DTI to the H level in synchronization with rising of the output pulse from the AND circuit A1. The output from the latch L2 is the output data DTO from the mixer 62. The clock CKI is the clock CKO from the mixer 62. The clock CKO and the output data DTO are delayed by the buffers 63 and 64 and then output as the clock MCLK and the output data MDAT to the FPGA 70. In FIG. 14, MCLK and MDAT indicate these outputs.

In FIG. 14, MDAT indicates that the output data MDAT is forcibly changed to the H level at a timing of the output pulse from the AND circuit A1. The output data MDAT is changed to the H level at the timing of the output pulse from the AND circuit A1 even when the output data DTI is at the L level at the timing of the output pulse from the AND circuit A1. In the example of FIG. 14, it is indicated that data D1, D2, and D3 among data D0, D1, . . . are forcibly changed to the H level.

The clock MCLK and the output data MDAT from the isolation amplifier 3 are supplied to the latch 81 of the external circuit 80. The latch 81 acquires the clock MCLK and outputs the clock MCLK as the detection result FAULTN at a timing of rising of the output data MDAT. When forcible level change is not performed, data value switching of the output data MDAT occurs in the L-level duration of the clock MCLK. However, when forcible level change to the H level is performed halfway through the data, the H level of the clock can be latched at a timing of the rising edge of the output data MDAT. Accordingly, the detection result FAULTN indicated as FAULTN in FIG. 14 can be obtained.

In FIG. 14, a dashed line indicates that the detection result FAULTN depends on the output data MDAT. For example, when the data D1 is initially at the L level, the data D1 is forcibly changed to the H level at the timing of the output pulse from the AND circuit A1. In this case, the H level of the clock MCLK is acquired at a rising edge of the data D1. In other words, the detection result FAULTN changes to the H level at a timing when the data D1 is input to the external circuit 80.

However, when the data D1 is initially at the H level, the data D1 does not rise at the timing of the output pulse from the AND circuit A1, and thus the detection result FAULTN from the latch 81 remains at the L level. In other words, the dashed line in FAULTN indicates that the detection result FAULTN potentially changes to the H level at a timing of any of the data D1, D2, and D3. Note that, similarly, when the detection signal FLTN becomes the L level, the detection result FAULTN acquires and outputs the L level of the clock MCLK at a rising timing of any data D4, D5, . . . . For example, when the data D1 and D4 are initially at the L level and the data D3 is initially at the H level, the detection result FAULTN becomes the H level at a timing when the data D1 is input to the latch 81, and the detection result FAULTN becomes the L level at a timing when the data D4 is input to the latch 81.

The control circuit 90 determines an H-level duration of the detection result FAULTN as an anomaly detection result. Information of the data D0, D1, . . . is maintained as initial information at a rising timing of the clock MCLK, and the control circuit 90 can reliably acquire the data corresponding to the differential inputs VIN.

In this manner, in the present embodiment, a detection signal indicating anomaly occurrence is acquired in the primary circuit 10 and transmitted to the secondary circuit 60. In the secondary circuit 60, the transmitted detection signal is used to superimpose information indicating an anomaly detection duration on digital data, and the superimposed information is extracted without filtering. Accordingly, it is possible to perform high-speed conveyance of an anomaly detection result to a circuit at a later stage.

Fourth Embodiment

Figure 15:
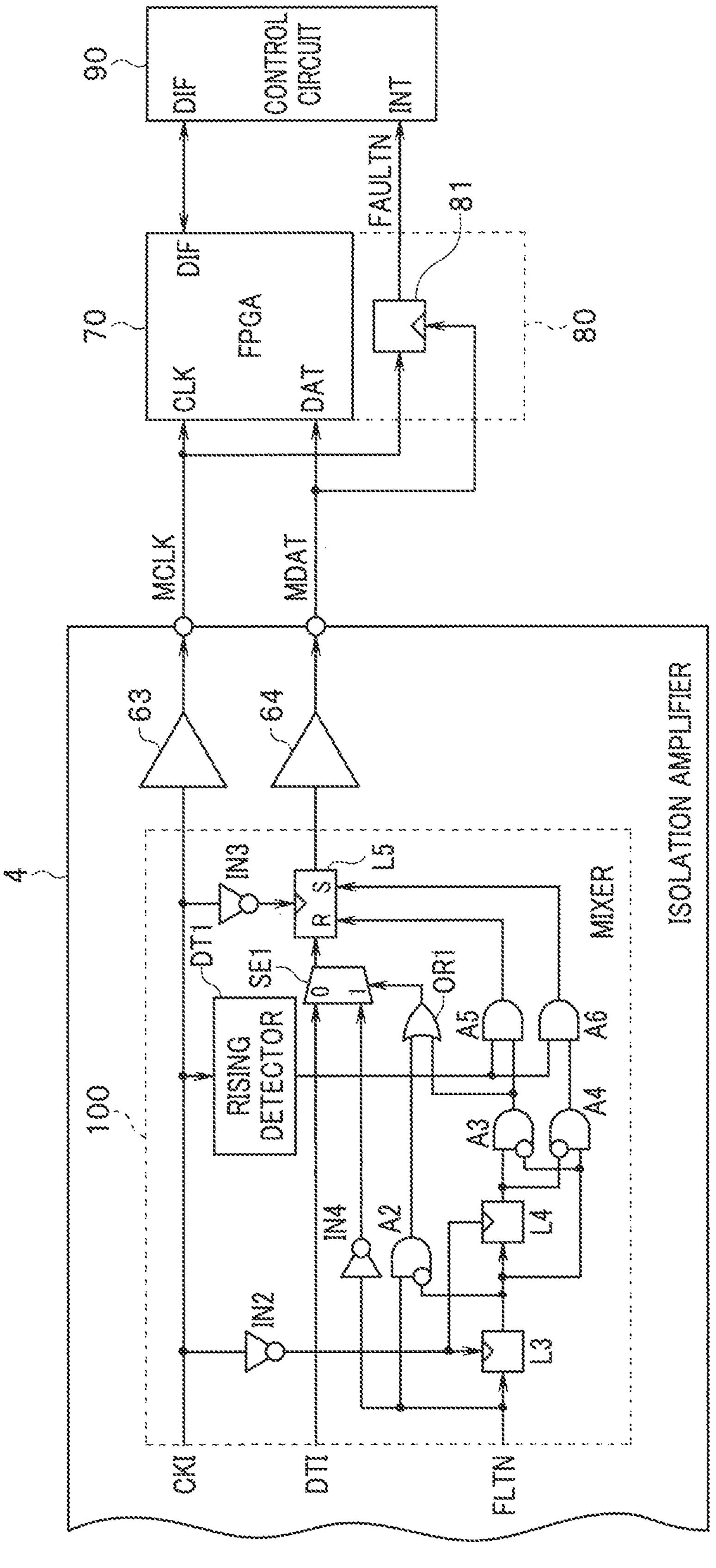
FIG. 15 is a block diagram illustrating an example of a specific configuration of a mixer employed in a fourth embodiment of the present invention.

FIG. 15 is a block diagram illustrating an example of a specific configuration of a mixer employed in a fourth embodiment of the present invention. In FIG. 15, any component same as a component in FIG. 13 is denoted by the same reference sign, and description of the component will be omitted. Note that an isolation amplifier 4 of the present embodiment is different from the isolation amplifier in FIG. 12 in that a mixer 100 is employed in place of the mixer 62, and thus description of any component other than the mixer 100 is omitted.

In the above-described third embodiment, the detection result FAULTN is not obtained in some cases, depending on a logic level of the transmitted output data MDAT. Thus, in the present embodiment, data at rising and falling timings of the detection signal FLTN is forcibly rewritten so that the detection result FAULTN can be reliably obtained.

In FIG. 15, the clock CKI is supplied to inverters IN2 and IN3 and the rising detector DT1 included in the mixer 100 and is also directly supplied to the buffer 63. The output data DTI is supplied to a selector SEL The detection signal FLTN is supplied to an inverter IN4, an AND circuit A2, and a latch L3.

The inverter IN2 inverts the clock CKI and provides the inverted clock CKI to the latch L3. The latch L3 acquires the detection signal FLTN in synchronization with the falling edge of the clock CKI and outputs the acquired detection signal FLTN to a latch L4 and an AND circuit A4, and also inverts the acquired detection signal FLTN and provides the inverted detection signal FLTN to the AND circuit A2. The AND circuit A2 outputs a result of an AND operation of the two inputs to an OR circuit OR1. The latch L4 acquires the output from the latch L3 in synchronization with the falling edge of the clock CKI and outputs the acquired output to an AND circuit A3, and also inverts the acquired output from the latch L3 and outputs the inverted output to the AND circuit A4.

The AND circuit A3 outputs a result of an AND operation of the two inputs to an AND circuit A5 and the OR circuit OR1. The OR circuit OR1 outputs a result of an OR operation of the two inputs as a selection signal to the selector SE1. The selector SE1 receives the detection signal FLTN inverted by the inverter IN4, selects one of the output data DTI and the inversion signal of the detection signal FLTN in accordance with the selection signal from the OR circuit OR1, and outputs the selected one to a latch L5.

The AND circuit A5 outputs a result of an AND operation of the output from the rising detector DT1 and the output from the AND circuit A3 to an R end of the latch L5. An AND circuit A6 outputs a result of an AND operation of the output from the rising detector DT1 and an output from the AND circuit A4 to an S end of the latch L5. The latch L5 acquires and outputs the output from the selector SE1 in synchronization with the falling edge of the clock CKI from the inverter IN3, outputs the H level in response to an H-level output from the AND circuit A5, and outputs the L level in response to an H-level output from the AND circuit A6. The output from the latch L5 becomes the output (output data MDAT) from the isolation amplifier 4 through the buffer 64.

Figure 16:
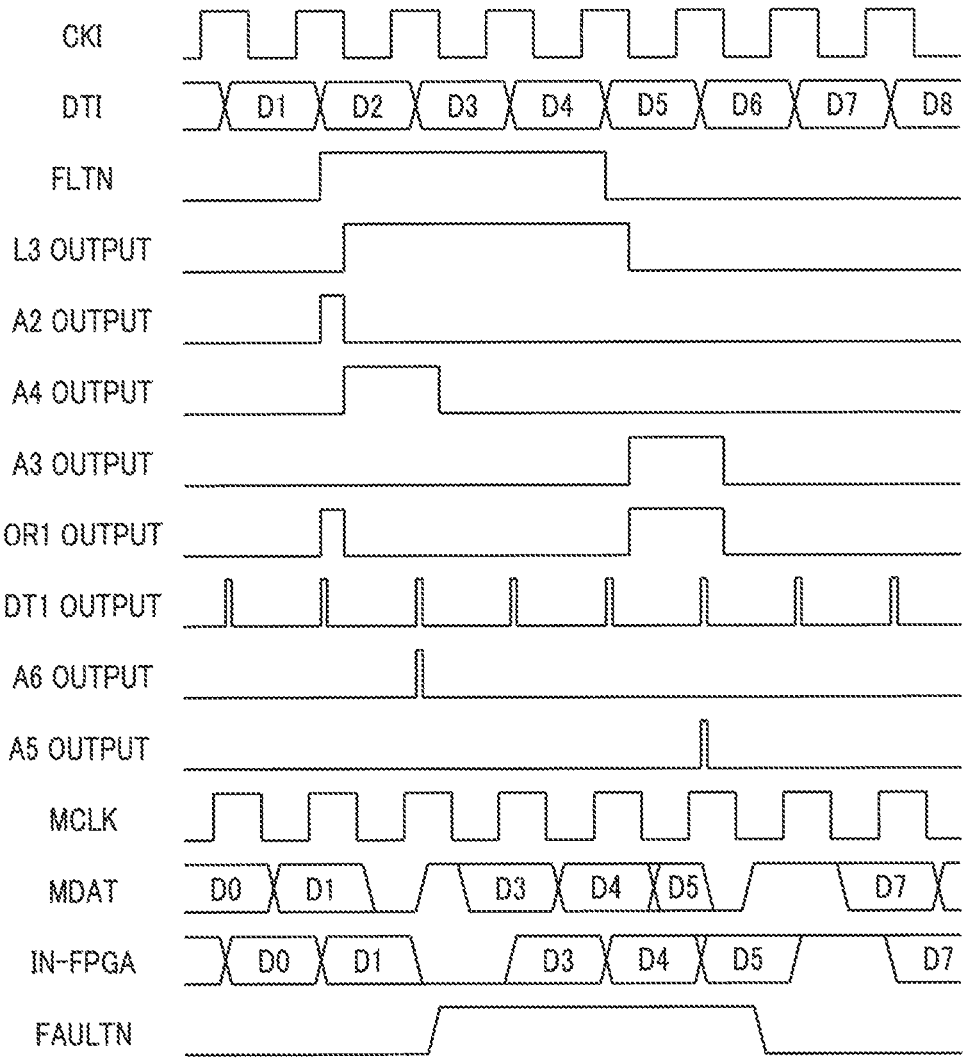
FIG. 16 is a timing chart for description of operation of the fourth embodiment.

Subsequently, operation of the embodiment thus configured will be described below with reference to FIG. 16. FIG. 16 is a timing chart for description of operation of the fourth embodiment.

The decoder 61 of the secondary circuit 60 outputs the clock CKI and also outputs the output data DTI in synchronization with the clock CKI. In FIG. 16, CKI and DTI indicate these clock and data. The clock CKI and the output data DTI are output as the clock MCLK and the output data MDAT through the mixer 100 and the buffers 63 and 64.

Assume the normal state in which no anomaly such as excessive input occurs. In this case, the detection signal FLTN is at the L level. Thus, all outputs from the latches L3 and L4, the AND circuits A2 to A6, and the OR circuit OR1 in the mixer 100 are at the L level. Accordingly, the selector SE1 selects the output data DTI and outputs the output data DTI to the latch L5. The latch L5 outputs the output from the selector SE1 to the buffer 64 in synchronization with the falling edge of the clock CKI. Accordingly, in this case, the clock MCLK and the output data MDAT correspond to the clock CKI and the output data DTI, respectively. Note that, in the present embodiment as well, a data value of the output data MDAT changes in the L-level duration of the clock MCLK.

Subsequently, assume that anomaly such as excessive input occurs and the detection signal FLTN changes to the H level. In FIG. 16, FLTN indicates this state. In the present embodiment as well, similarly to the first embodiment, when the detection signal FLTN has changed to the H level, the mixer 100 forcibly changes the output data MDAT to the H level in an H-level duration of the clock MCLK. Moreover, in the present embodiment, when the detection signal FLTN has changed to the H level, the mixer 100 forcibly changes the output data to the L level at a timing corresponding to a timing of this change, or when the detection signal FLTN has changed to the L level, the mixer 100 forcibly changes the output data to the H level at the timing corresponding to the timing of the change.

In other words, the latch L3 acquires and outputs the detection signal FLTN in synchronization with the falling edge of the clock CKI (L3 output in FIG. 16). The AND circuit A2 outputs a pulse (A2 output in FIG. 16) that becomes the H level in a duration from rising of the detection signal FLTN to falling of the clock CKI to the OR circuit OR1 through an AND operation of an inversion signal of the output from the latch L3 and the detection signal FLTN.

The latch L4 outputs an output delayed behind the output from the latch L3 by one clock to the AND circuit A3, and also inverts the output and outputs the inverted output to the AND circuit A4. The output from the AND circuit A4 is at the H level for one clock duration from falling of the clock CKI after the detection signal FLTN has become the H level (A4 output in FIG. 16). The output from the AND circuit A3 is at the H level for one clock duration from falling of the clock CKI after the detection signal FLTN has become the L level (A3 output in FIG. 16).

The OR circuit OR1 performs an OR operation of the output from the AND circuit A2 and the output from the AND circuit A3, and outputs a pulse that becomes the H level in a duration in which the two inputs become the H level (OR1 output in FIG. 16). The selector SE1 selects and outputs the output data DTI in a L-level duration of the selection signal from the OR circuit OR1, and selects and outputs the inversion signal of the detection signal FLTN in an H-level duration of the selection signal. In other words, the output from the selector SE1 in the H-level duration of the selection signal is at the L level right after rising of the detection signal FLTN, and is at the H level right after falling of the detection signal FLTN.

The rising detector DT1 detects the rising edge of the clock CKI and outputs the rising-edge detection pulse (DT1 output in FIG. 16). The AND circuit A6 outputs, to the S end of the latch L5, a result of an AND operation of the rising-edge detection pulse from the rising detector DT1 and the output from the AND circuit A4 (A6 output in FIG. 16). In other words, the output from the AND circuit A6 is the rising-edge detection pulse generated in an H-level duration of the output from the AND circuit A4, which becomes the H level after rising of the detection signal FLTN.

The AND circuit A5 outputs a result of an AND operation of the output from the rising detector DT1 and the output from the AND circuit A3 (A5 output in FIG. 16). In other words, the output from the AND circuit A5 is the rising-edge detection pulse generated in an H-level duration of the output from the AND circuit A3, which becomes the H level after falling of the detection signal FLTN.

The latch L5 selects and outputs the output (output data DTI) from the selector SE1 in a duration in which the outputs from the AND circuits A5 and A6 are both at the L level. The latch L5 outputs the H level in response to the rising-edge detection pulse supplied from the AND circuit A5 to the R end, and outputs the L level in response to the rising-edge detection pulse supplied from the AND circuit A6 to the S end.

As a result, as illustrated in FIG. 16, among the data D0, D1, . . . of the output data MDAT, the data D2 is forcibly set to the L level, and the data D6 is forcibly set to the H level. The clock MCLK and the output data MDAT are supplied to the FPGA 70. As illustrated in in-FPGA in FIG. 16, values of the data D2 and D6 are lost in the output data MDAT processed in the FPGA 70 due to the forcible level change by the mixer 100.

The latch 81 of the external circuit 80 acquires the clock MCLK at the timing of rising of the output data MDAT and outputs the acquired clock MCLK as the detection result FAULTN. As illustrated in FIG. 16, the detection result FAULTN becomes the H level at a timing of the rising-edge detection pulse after the detection signal FLTN has become the H level, and the detection result FAULTN becomes the L level at a timing of the rising-edge detection pulse after the detection signal FLTN has become the L level.

Accordingly, with the detection result FAULTN, it is possible to perform high-speed conveyance of an anomaly detection result to the control circuit 90.

In this manner, in the present embodiment as well, it is possible to obtain effects same as effects of the third embodiment. In the present embodiment, since a value of data is forcibly changed at a change timing of the detection signal FLTN, the detection result FAULTN indicating an anomaly detection result can be reliably obtained.

Fifth Embodiment

Figure 17:
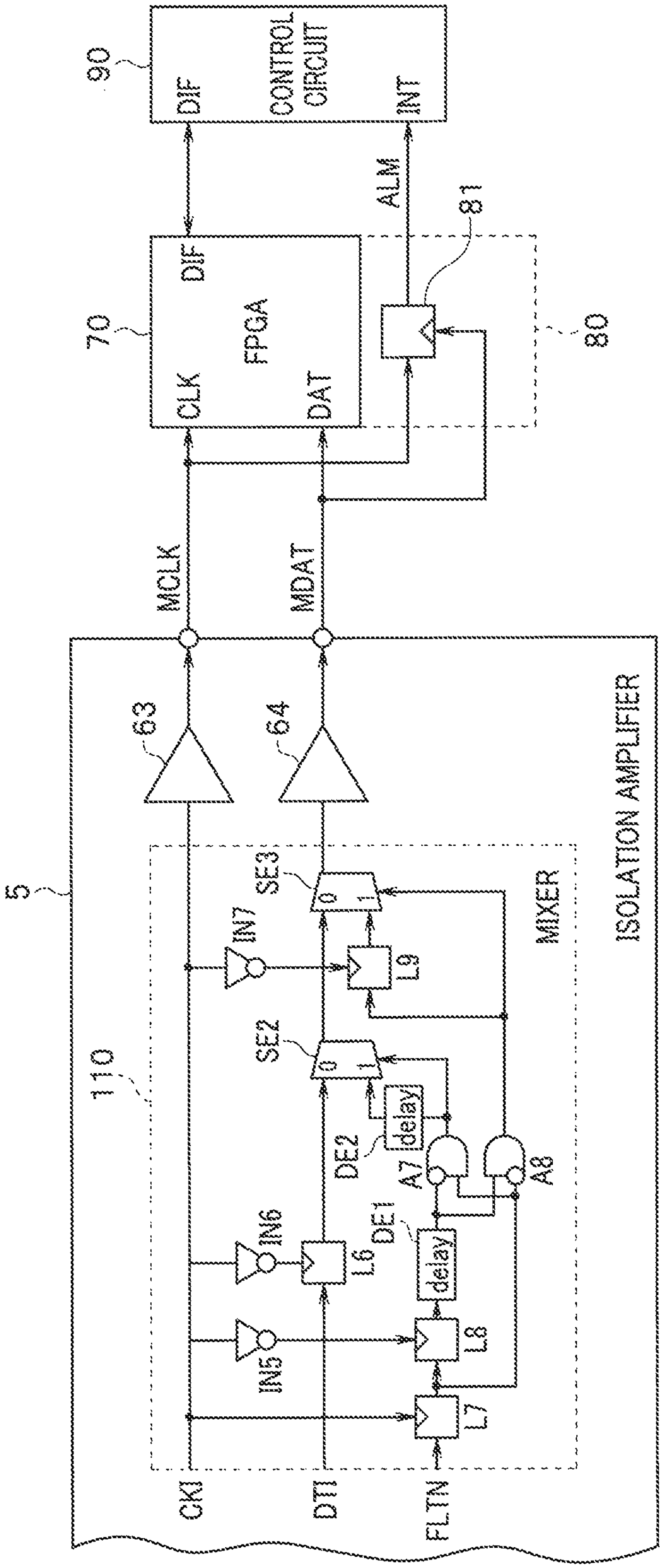
FIG. 17 is a block diagram illustrating an example of a specific configuration of a mixer employed in a fifth embodiment of the present invention.

FIG. 17 is a block diagram illustrating an example of a specific configuration of a mixer employed in a fifth embodiment of the present invention. In FIG. 17, any component same as a component in FIG. 13 is denoted by the same reference sign, and description of the component will be omitted. Note that an isolation amplifier 5 of the present embodiment is different from the isolation amplifier in FIG. 12 in that a mixer 110 is employed in place of the mixer 62, and thus description of any component other than the mixer 110 is omitted.

In the fourth embodiment, data loss occurs because the output data MDAT is forcibly changed to the L or H level. The present embodiment prevents this data loss. For this, at rising of the detection signal FLTN, the mixer 110 of the present embodiment sets a second half of data to the L level in the H-level duration of the clock MCLK and then to the H level. At falling of the detection signal FLTN, the mixer 110 sets the second half of data to the L level in the L-level duration of the clock MCLK and then to the H level.

In FIG. 17, the clock CKI is supplied to inverters IN5, IN6, and IN7 included in the mixer 110 and is also directly supplied to the buffer 63. The output data DTI is supplied to a latch L6. The detection signal FLTN is supplied to a latch L7.

The inverters IN5 to IN7 invert the clock CKI and provide the inverted clock CKI to latches L8, L6, and L9, respectively. The latch L6 acquires the output data DTI in synchronization with the falling edge of the clock CKI and outputs the acquired output data DTI to a selector SE2. The latch L7 acquires the detection signal FLTN in synchronization with the clock CKI and outputs the acquired detection signal FLTN to the latch L8 and an AND circuit A7, and also outputs the inversion signal of the detection signal FLTN to an AND circuit A8. The latch L8 acquires the output from the latch L7 in synchronization with the falling edge of the clock CKI and outputs the acquired output to a delay circuit (delay) DE1. The delay circuit DE1 provides, to the AND circuit A8, a delay output obtained by delaying the output from the latch L8, and also inverts the delay output and outputs the inverted delay output to the AND circuit A7.

The AND circuit A7 outputs a result of an AND operation of the two inputs as a selection signal to the selector SE2, and also outputs the result of the AND operation to a delay circuit DE2. The delay circuit DE2 delays the output from the AND circuit A7 and then outputs the delayed output to the selector SE2. The selector SE2 selects the output from the latch L6 or the output from the delay circuit DE2 based on the selection signal from the AND circuit A7, and outputs the selected output to a selector SE3.

The AND circuit A8 outputs a result of an AND operation of the two inputs as a selection signal to the selector SE3, and also outputs the result of the AND operation to the latch L9. The latch L9 acquires the output from the AND circuit A8 in synchronization with the falling edge of the clock CKI, and outputs the acquired output to the selector SE3. The selector SE3 selects the output from the selector SE2 or the output from the latch L9 based on the selection signal from the AND circuit A8, and outputs the selected output to the buffer 64.

Figure 18:
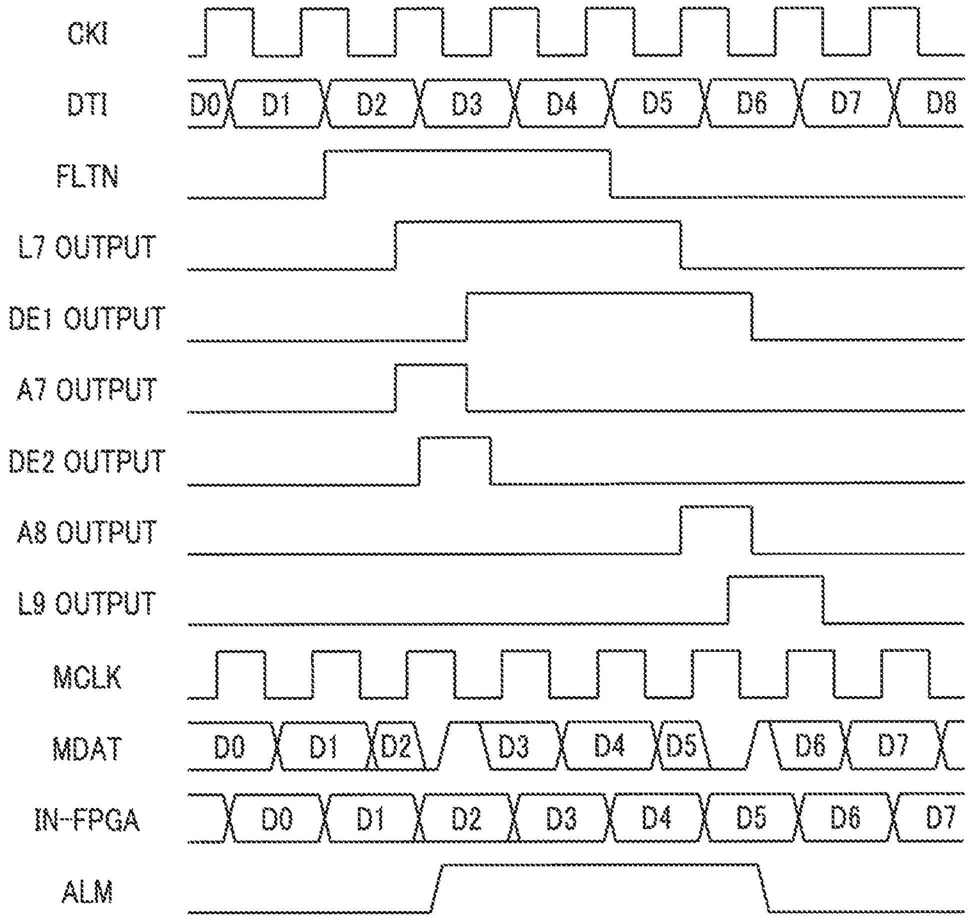
FIG. 18 is a timing chart for description of operation of the fifth embodiment.

Subsequently, operation of the embodiment thus configured will be described below with reference to FIG. 18. FIG. 18 is a timing chart for description of operation of the fifth embodiment.

The decoder 61 of the secondary circuit 60 outputs the clock CKI and also outputs the output data DTI in synchronization with the clock CKI. In FIG. 18, CKI and DTI indicate these clock and data. The clock CKI and the output data DTI are output as the clock MCLK and the output data MDAT through the mixer 110 and the buffers 63 and 64.

Assume the normal state in which no anomaly such as excessive input occurs. In this case, the detection signal FLTN is at the L level. Thus, all outputs from the latches L7, L8, and L9, the AND circuits A7 and A8, and the delay circuits DE1 and DE2 in the mixer 110 are at the L level. Accordingly, the selector SE2 selects the output from the latch L6, and the selector SE3 selects the output from the selector SE2. Accordingly, the output data DTI is supplied to the buffer 64 through the latch L6 and the selectors SE2 and SE3, and the output data MDAT corresponding to the output data DTI is output from the buffer 64 in synchronization with the clock MCLK.

Subsequently, assume that anomaly such as excessive input occurs and the detection signal FLTN changes to the H level. In FIG. 18, FLTN indicates this state. In the present embodiment as well, similarly to the first embodiment, when the detection signal FLTN has changed to the H level, the mixer 110 forcibly changes the output data MDAT to the H level in the H-level duration of the clock MCLK. In the present embodiment, when the detection signal FLTN has changed to the H level, the mixer 110 forcibly sets the output data to the L level in the H-level duration of the clock MCLK corresponding to a timing of this change and then to the H level, or when the detection signal FLTN has changed to the L level, the mixer 110 forcibly sets the output data to the L level and then to the H level in the L-level duration of the clock MCLK corresponding to a timing of this change.

In other words, the latch L7 acquires the detection signal FLTN in synchronization with rising of the clock CKI and outputs the acquired detection signal FLTN to the latch L8 (L7 output in FIG. 18). The latch L8 acquires the detection signal FLTN from the latch L7 at a falling timing of the clock CKI and outputs the acquired detection signal FLTN to the delay circuit DE1. The delay circuit DE1 delays and outputs the detection signal FLTN from the latch L8 (DE1 output in FIG. 18). In other words, the output from the delay circuit DE1 becomes the H level a predetermined duration after falling of the first clock CKI after rising of the detection signal FLTN.

The AND circuit A7 outputs a result of an AND operation of an inversion signal of the output from the delay circuit DE1 and the output from the latch L7. As illustrated in A7 output in FIG. 18, the output from the AND circuit A7 is a pulse that becomes the H level only for a predetermined duration width (in FIG. 18, a width equal to or longer than a half clock period) after falling of the first clock CKI after rising of the detection signal FLTN.

The delay circuit DE2 provides, to the selector SE2, an output (DE2 output in FIG. 18) obtained by delaying the output from the AND circuit A7. A delay time of the delay circuit DE2 is set to be a time longer than a duration necessary for sampling of the output data DTI and shorter than a half clock duration (duration in which the clock CKI is at the H level), after rising of the clock CKI. Thus, in a duration in which the output from the AND circuit A7 is at the H level, the output from the selector SE2 is at the L level right after the output from the AND circuit A7 has becomes the H level, and then becomes the H level after elapse of the delay time of the delay circuit DE2 since the output from the AND circuit A7 has become the H level.

The AND circuit A8 outputs, to the latch L9 and the selector SE2, a result of an AND operation of an inversion signal of the output from the latch L7 and the output from the delay circuit DEL As illustrated in A8 output in FIG. 18, the output from the AND circuit A8 is a pulse that becomes the H level only for a predetermined duration width (in FIG. 18, a width equal to or longer than the half clock period) after falling of the first clock CKI after falling of the detection signal FLTN.

The latch L9 acquires the output from the AND circuit A8 in synchronization with the falling edge of the clock CKI and provides the acquired output to the selector SE3 (L9 output in FIG. 18). The selector SE3 selects the output from the selector SE2 in an L-level duration of the output from the AND circuit A8, and selects the output from the latch L9 in an H-level duration of the output from the AND circuit A8. Thus, in a case in which the output from the AND circuit A8 becomes the H level, an output from the selector SE3 is at the L level right after the output from the AND circuit A8 has become the H level, and then becomes the H level at the falling timing of the next clock CKI after the output from the AND circuit A8 has become the H level. The output from the selector SE3 is output as the output data MDAT from the isolation amplifier 5 through the buffer 64.

As a result, as illustrated in FIG. 18, among the data D0, D1, . . . of the output data MDAT, the data D2 is forcibly set to the L level in a middle at a timing of the data D2 corresponding to rising of the detection signal FLTN, and is set back to the H level in the H-level duration of the clock MCLK. Among the data D0, D1, . . . of the output data MDAT, the data D5 is forcibly set to the L level in a middle at a timing of the data D5 corresponding to falling of the detection signal FLTN, and is set back to the H level in the L-level duration of the clock MCLK.

The clock MCLK and the output data MDAT are supplied to the FPGA 70. The latch 81 of the external circuit 80 acquires the clock MCLK at the timing of rising of the output data MDAT and outputs the acquired clock MCLK as the detection result FAULTN. As illustrated in FIG. 18, the detection result FAULTN becomes the H level about one clock after the detection signal FLTN has become the H level, and becomes the L level about one and half clocks after the detection signal FLTN has become the L level.

Accordingly, with the detection result FAULTN, it is possible to perform high-speed conveyance of an anomaly detection result to the control circuit 90. Moreover, even with the forcible level change by the mixer 110, no data loss occurs to the output data MDAT processed in the FPGA 70 as illustrated in in-FPGA in FIG. 18.

In this manner, in the present embodiment as well, it is possible to obtain effects same as effects of the third embodiment. In the present embodiment, the value of data is held when a level of the data is forcibly changed at a change timing of the detection signal FLTN, and thus the detection result FAULTN indicating an anomaly detection result can be reliably obtained without data loss.

Sixth Embodiment

Figure 19:
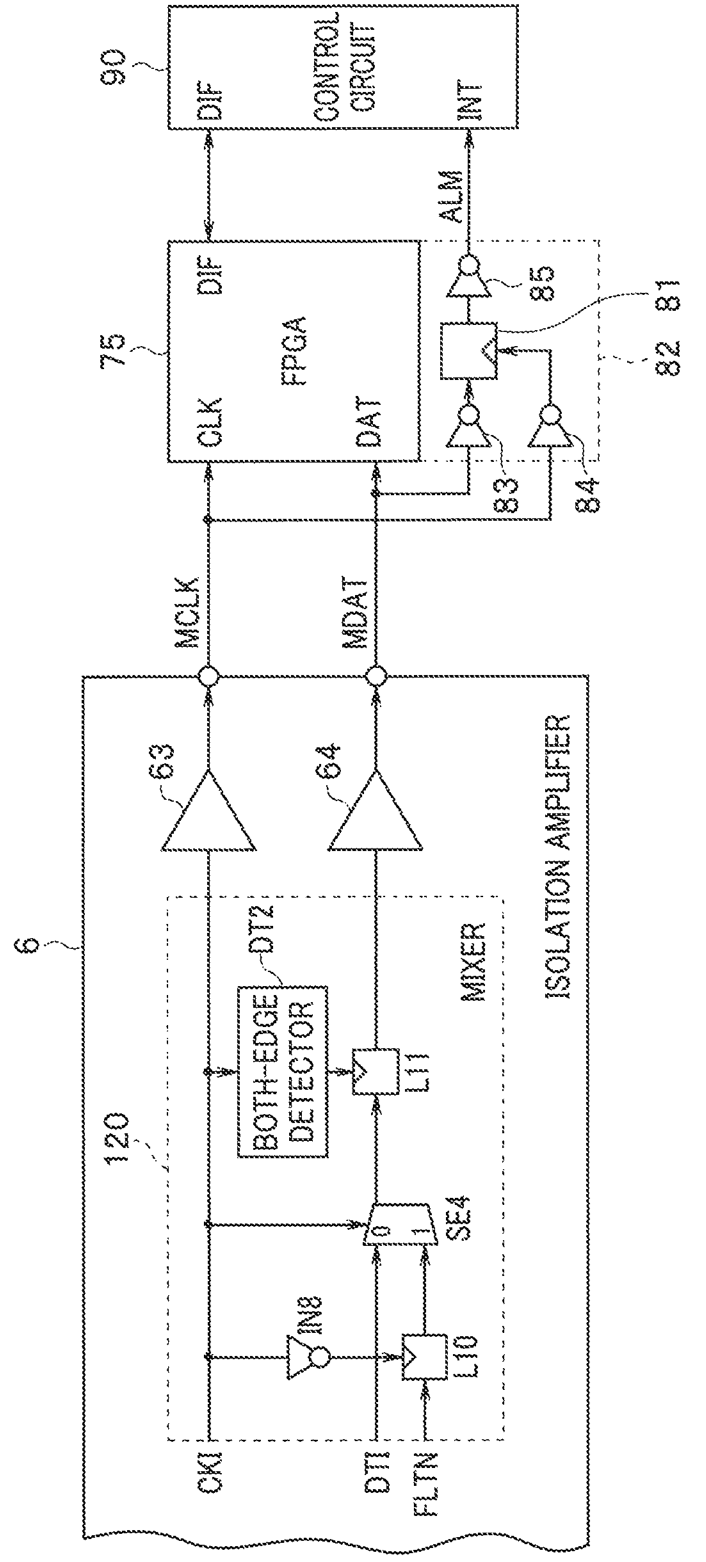
FIG. 19 is a block diagram illustrating an example of a specific configuration of a mixer employed in a sixth embodiment of the present invention.

FIG. 19 is a block diagram illustrating an example of a specific configuration of a mixer employed in a sixth embodiment of the present invention. In FIG. 19, any component same as a component in FIG. 13 is denoted by the same reference sign, and description of the component will be omitted. Note that an isolation amplifier 6 of the present embodiment is different from the isolation amplifier in FIG. 12 in that a mixer 120 is employed in place of the mixer 62, and thus description of any component other than the mixer 120 is omitted. Note that, in the present embodiment, an FPGA 75 capable of performing processing at a double data rate is employed in place of the FPGA 70. In addition, in the present embodiment, an external circuit 82 is employed in place of the external circuit 80 in FIG. 12.

In the present embodiment, a double-data-rate system in which data is transmitted at both edges of a clock is used to transmit data and the L level in one clock in the normal state and transmit data and the H level in one clock in the state of anomaly such as excessive input.

In FIG. 19, the clock CKI is supplied to an inverter IN8, a selector SE4, and a both-edge detector DT2 included in the mixer 120 and also directly supplied to the buffer 63. The output data DTI is supplied to the selector SE4. The detection signal FLTN is supplied to a latch L10. The inverter IN8 inverts the clock CKI and provides the inverted clock CKI to the latch L10. The latch L10 acquires the output data DTI in synchronization with the falling timing of the clock CKI and outputs the acquired output data DTI to the selector SE4.

The selector SE4 selects and outputs the output data DTI in response to the H level of the clock CKI, and selects and outputs the detection signal FLTN from the latch L10 in response to the L level of the clock CKI. The both-edge detector DT2 detects the rising and falling edges of the clock CKI and outputs an edge detection pulse to a latch L11. The latch L11 acquires the output from the selector SE4 at a timing of the edge detection pulse, and outputs the acquired output to the buffer 64.

Thus, the latch L11 outputs the output data DTI in synchronization with the rising edge of the clock CKI, and outputs the detection signal FLTN in synchronization with the falling edge of the clock CKI. Note that the latch L11 outputs the L level in synchronization with the falling edge of the clock CKI in an L-level duration of the detection signal FLTN in which no anomaly such as excessive input occurs, and the latch L11 outputs the H level in synchronization with the falling edge of the clock CKI in the H-level duration of the detection signal FLTN in which anomaly such as excessive input occurs.

The clock MCLK and the output data MDAT from the isolation amplifier 6 are supplied to the FPGA 75. A configuration of the FPGA 75 is same as a configuration of the FPGA 70 in FIG. 12 except that the FPGA 75 is capable of processing a double-data-rate signal. The FPGA 75 obtains the data corresponding to the differential inputs VIN by sampling the output data MDAT in synchronization with a rising edge of the clock MCLK. The FPGA 75 provides low-pass filtering or the like to the acquired data and then outputs the data to the control circuit 90.

In the present embodiment, the external circuit 82 includes inverters 83 to 85 and the latch 81. The inverter 83 inverts the output data MDAT and provides the inverted output data MDAT to the latch 81, and the inverter 84 inverts the clock MCLK and provides the inverted clock MCLK to a clock end of the latch 81. Accordingly, the latch 81 acquires and outputs an inversion signal of the output data MDAT in synchronization with a falling edge of the clock MCLK. The output from the latch 81 is provided to the inverter 85. The inverter 85 inverts the output from the latch 81 and outputs the inverted output as a detection result ALM to the INT end of the control circuit 90.

Figure 20:
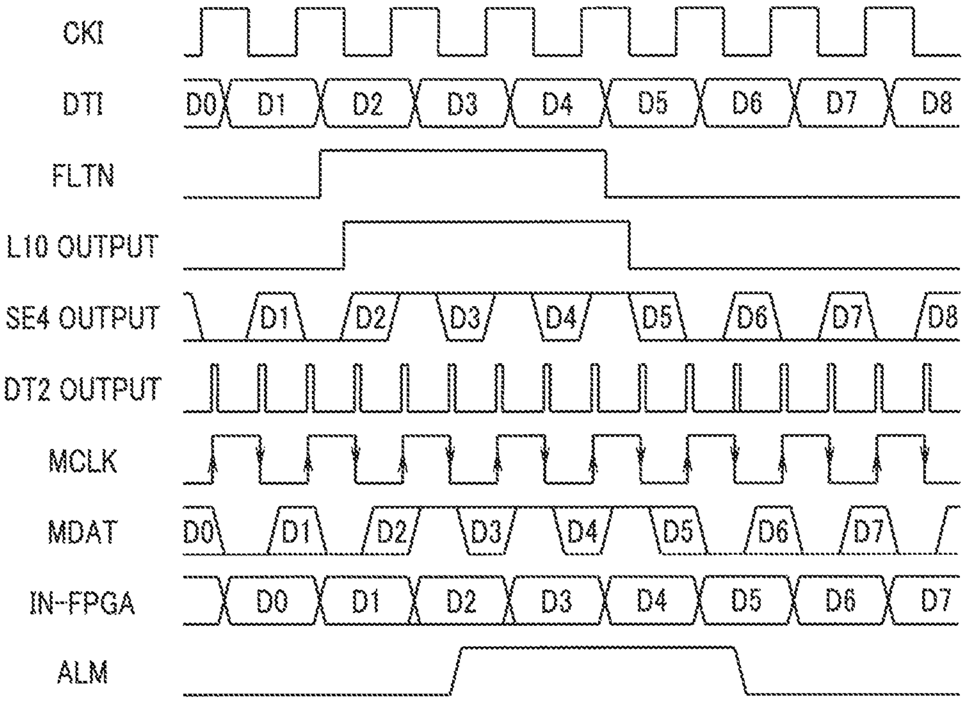
FIG. 20 is a timing chart for description of operation of the sixth embodiment.

Subsequently, operation of the embodiment thus configured will be described below with reference to FIG. 20. FIG. 20 is a timing chart for description of operation of the sixth embodiment.

The decoder 61 of the secondary circuit 60 outputs the clock CKI and also outputs the output data DTI in synchronization with the clock CKI. In FIG. 20, CKI and DTI indicate these clock and data. The clock CKI and the output data DTI are output as the clock MCLK and the output data MDAT through the mixer 120 and the buffers 63 and 64.

The both-edge detector DT2 detects rising and falling of the clock CKI and outputs an edge detection pulse (DT2 output in FIG. 20). By using the edge detection pulse generated at rising and falling of the clock CKI, the latch L11 acquires and outputs the output from the selector SE4. Thus, the output from the latch L11 is of a double data rate.

Assume the normal state in which no anomaly such as excessive input occurs. In this case, the detection signal FLTN is at the L level. Thus, the output from the latch L10 in the mixer 120 is at the L level. The selector SE4 acquires the output data DTI in response to the H level of the clock CKI and outputs the acquired output data DTI to L11, and acquires the detection signal FLTN in response to the L level of the clock CKI and outputs the acquired detection signal FLTN to L11. Thus, in this case, the output from the latch L11 includes information of the output data DTI in a duration synchronized with the H level of the clock CKI, and is at the L level in a duration synchronized with the L level of the clock CKI.

Subsequently, assume that anomaly such as excessive input occurs and the detection signal FLTN changes to the H level. In FIG. 20, FLTN indicates this state. The output from the latch L10 becomes the H level at falling of the first clock CKI after the detection signal FLTN has become the H level (L10 output in FIG. 20). The H-level output from the latch L11 is output from the selector SE4 in synchronization with falling of the clock CKI. Thus, when the detection signal FLTN has become the H level, the output from the latch L11 includes information of the output data DTI in the duration synchronized with the H level of the clock CKI, and becomes the H level in the duration synchronized with the L level of the clock CKI (SE4 output in FIG. 20). The output from the latch L11 is output as the output data MDAT from the isolation amplifier 6 through the buffer 64.

The clock MCLK and the output data MDAT from the isolation amplifier 6 are supplied to the FPGA 75. The FPGA 75 obtains the data corresponding to the differential inputs VIN by sampling the output data MDAT in synchronization with the rising edge of the clock MCLK.

The inverter 83 of the external circuit 82 inverts the output data MDAT and provides the inverted output data MDAT to the latch 81. The inverter 84 inverts the clock MCLK and provides the inverted clock MCLK to the clock end of the latch 81. Accordingly, the latch 81 acquires and outputs the inversion signal of the output data MDAT in synchronization with the falling edge of the clock MCLK. Thus, the latch 81 outputs the H level in accordance with the L-level duration of the detection signal FLTN and outputs the L level in accordance with the H-level duration of the detection signal FLTN. The output from the latch 81 becomes the detection result ALM through inversion by the inverter 85. As illustrated in ALM in FIG. 20, the detection result ALM is a signal corresponding to the detection signal FLTN. The detection result ALM from the inverter 85 is supplied to the control circuit 90.

Accordingly, with the detection result ALM, it is possible to perform high-speed conveyance of an anomaly detection result to the control circuit 90. Moreover, no data loss occurs to the output data MDAT processed in the FPGA 75 as illustrated in in-FPGA in FIG. 20.

In this manner, in the present embodiment as well, it is possible to obtain effects same as effects of the fifth embodiment.

Seventh Embodiment

Figure 21:
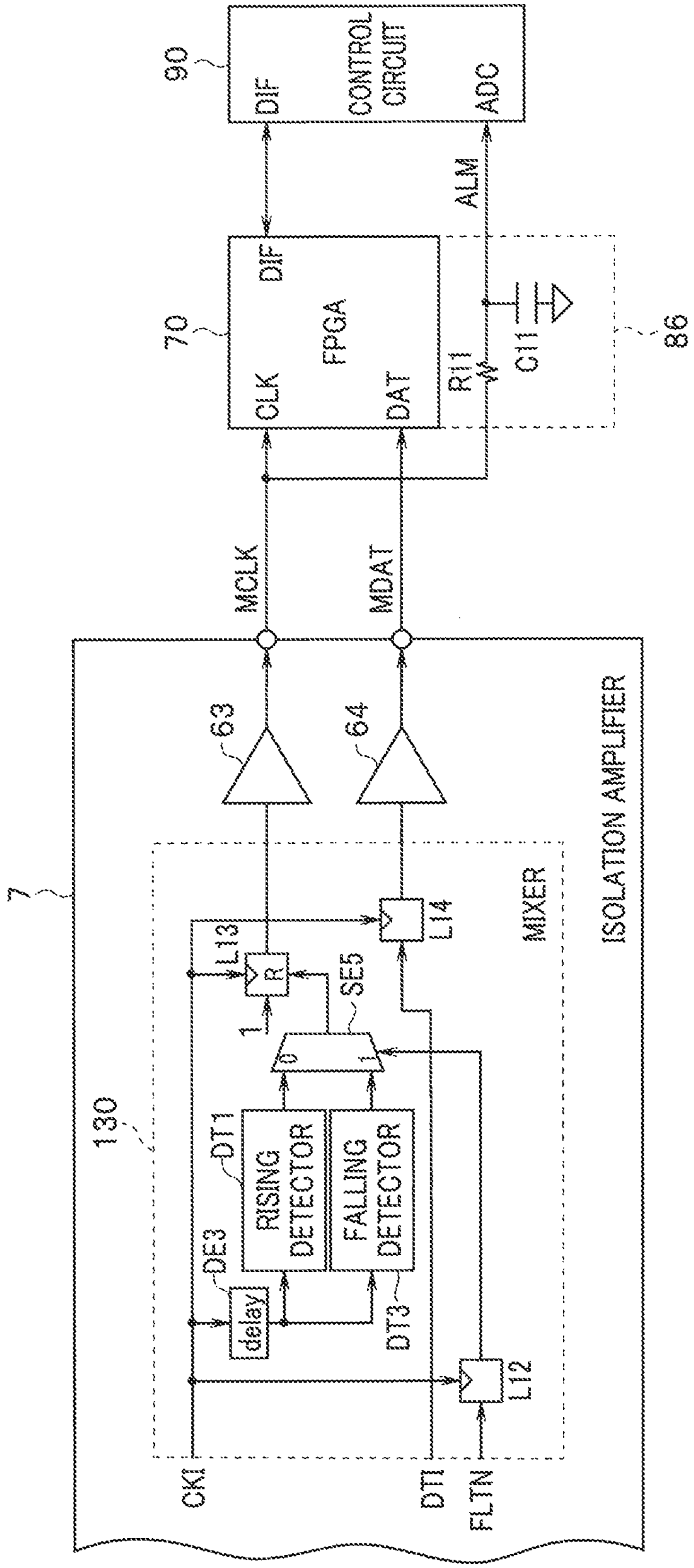
FIG. 21 is a block diagram illustrating an example of a specific configuration of a mixer employed in a seventh embodiment of the present invention.

FIG. 21 is a block diagram illustrating an example of a specific configuration of a mixer employed in a seventh embodiment of the present invention. In FIG. 21, any component same as a component in FIG. 13 is denoted by the same reference sign, and description of the component will be omitted. Note that an isolation amplifier 7 of the present embodiment is different from the isolation amplifier in FIG. 12 in that a mixer 130 is employed in place of the mixer 62, and thus description of any component other than the mixer 130 is omitted. Note that, in the present embodiment, an external circuit 86 is employed in place of the external circuit 80 in FIG. 12.

Note that, in the third to sixth embodiments, it is described that any of a clock generated at the clock regeneration circuit 24 and a clock acquired from the outside of the isolation amplifier may be employed as the clock CKI, but in the present embodiment, the clock generated at the clock regeneration circuit 24 is used as the clock CKI.

The above-described third to sixth embodiments describe an example in which information of the detection signal FLTN is superimposed on the output data MDAT and transmitted. The present embodiment is an example in which information of the detection signal FLTN is transmitted by a clock.

In FIG. 21, the clock CKI is supplied to latches L12, L13, and L14 and a delay circuit DE3 included in the mixer 130. In the present embodiment, the mixer 130 supplies the input clock CKI to the buffer 63 through the latch L13. The output data DTI is supplied to the latch L14. The latch L14 latches the output data DTI in synchronization with the clock CKI and outputs the latched output data DTI to the buffer 64.

The detection signal FLTN is supplied to the latch L12. The latch L12 acquires the detection signal FLTN in synchronization with the rising edge of the clock CKI and supplies the acquired detection signal FLTN as a selection signal to a selector SE5. The delay circuit DE3 outputs, to the rising detector DT1 and a falling detector DT3, a delay signal obtained by delaying the clock CKI by a predetermined delay time. The rising detector DT1 detects the rising edge of the clock CKI delayed by the delay circuit DE3 and outputs an edge detection pulse to the selector SE5. The falling detector DT3 detects the falling edge of the clock CKI delayed by the delay circuit DE3 and outputs an edge detection pulse to the selector SE5.

The selector SE5 selects the edge detection pulse from the rising detector DT1 in the H-level duration of the detection signal FLTN from the latch L12 and provides the selected edge detection pulse to an R end of the latch L13, and selects the edge detection pulse from the falling detector DT3 in the L-level duration of the detection signal FLTN from the latch L12 and provides the selected edge detection pulse to the R end of the latch L13.

The latch L13 acquires and outputs the input H level (logic value "1") at rising of the clock CKI, and sets the output back to the L level when the edge detection pulse from the selector SE5 is input to the R end. In other words, in the L-level duration of the detection signal FLTN from the latch L12, the output from L13 is a pulse output that has a relatively short pulse width, becomes the H level in response to rising of the clock CKI, and becomes the L level at the timing of the edge detection pulse from the rising detector DT1. In the H-level duration of the detection signal FLTN from the latch L12, the output from L13 is a pulse output that has a relatively long pulse width, becomes the H level in response to rising of the clock CKI, and becomes the L level at the timing of the edge detection pulse from the falling detector DT3. The output from the latch L13 is output as the clock MCLK from the isolation amplifier 7 through the buffer 63.

The clock MCLK and the output data MDAT from the isolation amplifier 7 are also provided to the external circuit 86. The external circuit 86 includes a low-pass filter formed by a capacitor C11 and a resistor R11. The resistor R11 has one end connected with an output end of the isolation amplifier 7 for the clock MCLK, and the other end connected with the reference potential point through the capacitor C11. A connection point between the capacitor C11 and the resistor R11 is connected with an ADC end of the control circuit 90.

The external circuit 86 calculates an average value of a voltage level of the clock MCLK and supplies the calculated average value as the detection result ALM to the ADC end of the control circuit 90.

Figure 22:
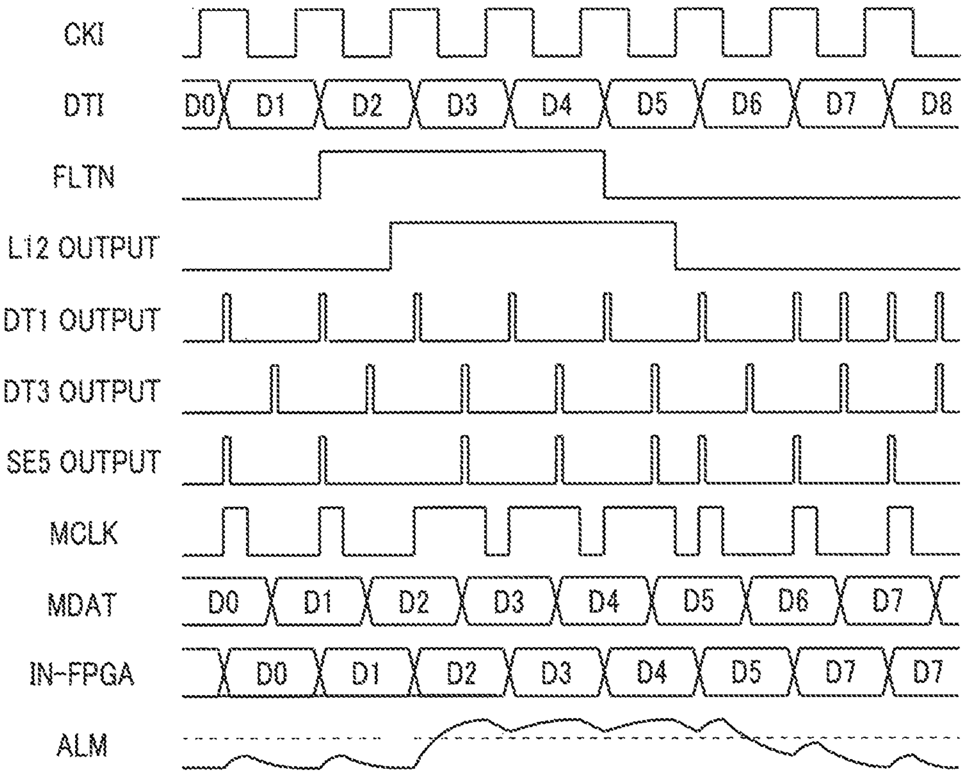
FIG. 22 is a timing chart for description of operation of the seventh embodiment.

Subsequently, operation of the embodiment thus configured will be described below with reference to FIG. 22. FIG. 22 is a timing chart for description of operation of the seventh embodiment.

The decoder 61 of the secondary circuit 60 outputs the clock CKI and also outputs the output data DTI in synchronization with the clock CKI. In FIG. 22, CKI and DTI indicate these clock and data. The clock CKI and the output data DTI are output as the clock MCLK and the output data MDAT through the mixer 130 and the buffers 63 and 64.

The output data DTI is supplied to the latch L14, and the latch L14 outputs the output data DTI to the buffer 64 in synchronization with the rising edge of the clock CKI. Accordingly, the output data MDAT (MDAT in FIG. 22) from the isolation amplifier 7 is information corresponding to the output data DTI and output in synchronization with rising of the clock CKI.

The clock CKI is supplied to the latch L13. The latch L13 outputs the H level of a logic value "1" at the timing of rising of the clock CKI. The output from the latch L13 is output as the clock MCLK through the buffer 63. Thus, rising of the clock MCLK is synchronized with rising of the clock CKI.

The clock CKI is also supplied to the delay circuit DE3. The delay circuit DE3 delays the clock CKI and then outputs a delay signal to the rising detector DT1 and the falling detector DT3. The rising detector DT1 detects a rising edge of the delay signal and outputs an edge detection pulse to the selector SE5, and the falling detector DT3 detects a falling edge of the delay signal and outputs an edge detection pulse to the selector SE5. The output from the selector SE5 is supplied to the R end of the latch L13, and the output from the latch L13 becomes the L level at a timing of an output pulse from the selector SE5.

Assume the normal state in which no anomaly such as excessive input occurs. In this case, the detection signal FLTN is at the L level. Thus, the selector SE5 selects the edge detection pulse from the rising detector DT1 and provides the selected edge detection pulse to the latch L13. In this case, the output from the latch L13 outputs a pulse that has a relatively narrow width, becomes the H level at rising of the clock CKI, and becomes the L level in response to rising of the clock CKI.

Subsequently, assume that anomaly such as excessive input occurs and the detection signal FLTN changes to the H level. In FIG. 22, FLTN indicates this state. The output from the latch L12 becomes the H level at rising of the first clock CKI after the detection signal FLTN has become the H level (L12 output in FIG. 22). The edge detection pulse from the rising detector DT1 is a pulse generated a delay time of the delay circuit DE3 after rising of the clock CKI (DT1 output in FIG. 22). The output from the falling detector DT3 is a pulse generated at the falling edge of the clock CKI, the delay time of the delay circuit DE3 after rising of the clock CKI (DT3 output in FIG. 22).

In a duration corresponding to the L-level duration of the detection signal FLTN, the output from the latch L13 is a narrow-width pulse that becomes the H level at rising of the clock CKI and becomes the L level at the timing of the edge detection pulse from the rising detector DT1. In a duration corresponding to the H-level duration of the detection signal FLTN, the output from the latch L13 is a wide-width pulse that becomes the H level at rising of the clock CKI and becomes the L level at the timing of the edge detection pulse from the falling detector DT3 (MCLK in FIG. 22).

The clock MCLK and the output data MDAT are supplied to the FPGA 70. As illustrated in in-FPGA in FIG. 22, the output data MDAT is synchronized with the clock MCLK and can be processed at the FPGA 70.

The clock MCLK is also supplied to the external circuit 86. The clock MCLK is averaged through the low-pass filter formed by the capacitor C11 and R11 of the external circuit 86. The external circuit 86 outputs the averaged clock MCLK as the detection result ALM to the control circuit 90.

As illustrated in ALM in FIG. 22, since the clock MCLK is averaged by the external circuit 86, a level of the detection result ALM is relatively low in a duration in which the clock MCLK has a narrow width, and the level of the detection result ALM is relatively high in a duration in which the clock MCLK has a wide width. The control circuit 90 obtains an anomaly detection result by, for example, comparing the level of the detection result ALM with a level illustrated with a dashed line in FIG. 22.

In this manner, in the present embodiment as well, it is possible to obtain effects same as effects of the fifth embodiment.

Eighth Embodiment

Figure 23:
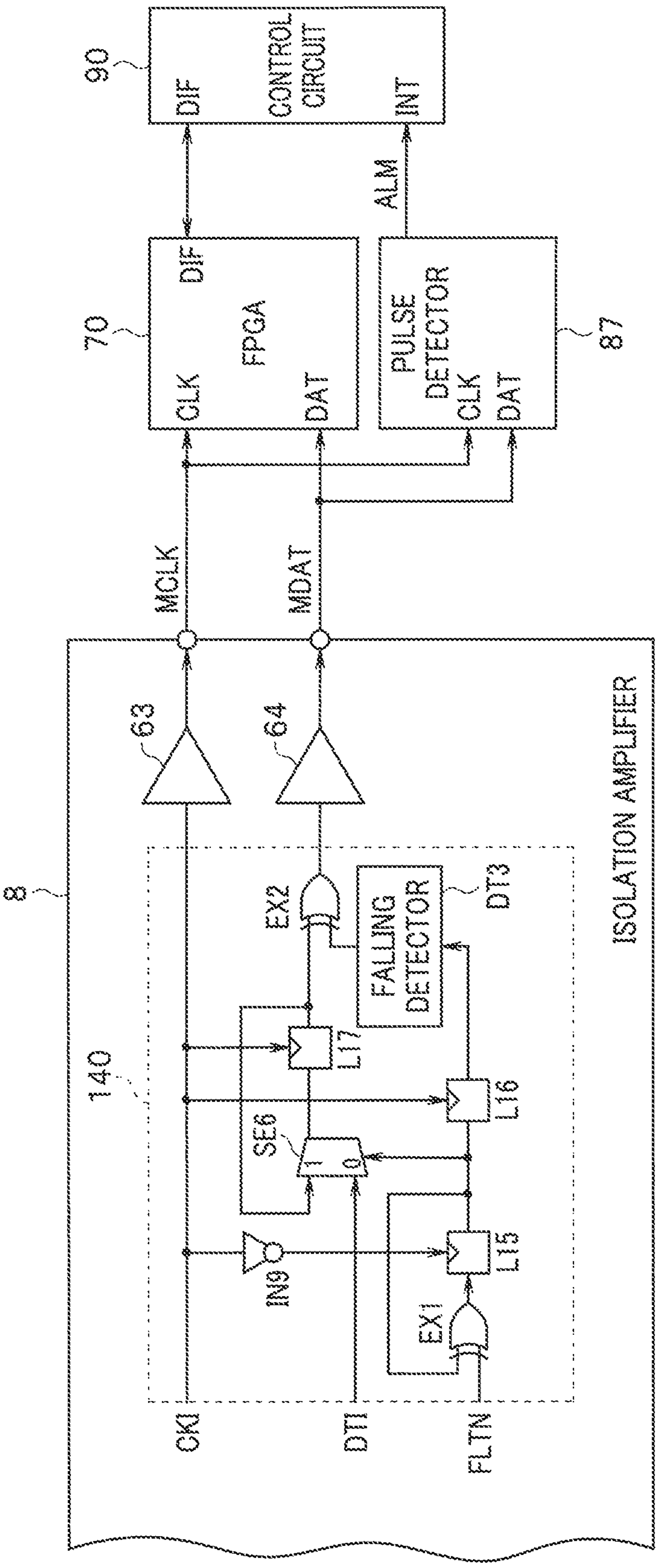
FIG. 23 is a block diagram illustrating an example of a specific configuration of a mixer employed in an eighth embodiment of the present invention.

FIG. 23 is a block diagram illustrating an example of a specific configuration of a mixer employed in an eighth embodiment of the present invention. In FIG. 23, any component same as a component in FIG. 13 is denoted by the same reference sign, and description of the component will be omitted. Note that an isolation amplifier 8 of the present embodiment is different from the isolation amplifier in FIG. 13 in that a mixer 140 is employed in place of the mixer 62, and thus description of any component other than the mixer 140 is omitted. Note that, in the present embodiment, a pulse detector 87 as an external circuit is employed in place of the external circuit 80 in FIG. 13.

The present embodiment is an example in which information of the detection signal FLTN is superimposed and transmitted in an ineffective duration of the output data MDAT. In the FPGA 70 at a later stage of the isolation amplifier 8, the output data MDAT is sampled in the H-level duration of the clock MCLK. Thus, in the present embodiment, information of the detection signal FLTN is superimposed by using the ineffective duration of the output data MDAT corresponding to the L-level duration of the clock MCLK.

In FIG. 23, the clock CKI is supplied to an inverter IN9 and latches L16 and L17 included in the mixer 140 and also directly supplied to the buffer 63. The output data DTI is supplied to a selector SE6. The detection signal FLTN is supplied to an XOR circuit EX1. The inverter IN9 inverts the clock CKI and provides the inverted clock CKI to a latch L15. The latch L15 acquires an output from the XOR circuit EX1 at a timing of the inverted clock of the clock CKI, outputs the acquired output as a selection signal to the selector SE6, and also outputs the acquired output to the XOR circuit EX1 and the latch L16.

The XOR circuit EX1 performs an exclusive OR operation (hereinafter, referred to as XOR operation) of the detection signal FLTN and the output from the latch L15 and outputs a result of the XOR operation to L15. An output from the selector SE6 is provided to the latch L17, and the latch L17 acquires the output from the selector SE6 at the rising edge of the clock CKI and outputs the acquired output to the selector SE6 and an XOR circuit EX2. The selector SE6 outputs the output data DTI when the selection signal is at the L level, and outputs the output from the latch L17 when the selection signal is at the H level.

The latch L16 acquires the output from the latch L15 at the rising edge of the clock CKI and outputs the acquired output to the falling detector DT3. The falling detector DT3 detects a falling edge of the output from the latch L15 and outputs an edge detection pulse to the XOR circuit EX2. The XOR circuit EX2 outputs, to the buffer 64, a result of an XOR operation of the output from the latch L17 and the output from the falling detector DT3.

With this configuration, as described later, a pulse that inverts and then inverts back a level of the output data MDAT is generated in the ineffective duration of the output data MDAT corresponding to rising and falling of the detection signal FLTN.

The clock MCLK and the output data MDAT from the isolation amplifier 8 are supplied to the FPGA 70. The FPGA 70 obtains the data corresponding to the differential inputs VIN by sampling the output data MDAT in synchronization with the rising edge of the clock MCLK.

In the present embodiment, the pulse detector 87 is employed as an external circuit. The clock MCLK from the isolation amplifier 8 is supplied to a CLK end of the pulse detector 87, and the output data MDAT from the isolation amplifier 8 is supplied to a DAT end of the pulse detector 87. The pulse detector 87 detects a pulse superimposed in the ineffective duration of the output data MDAT, generates the detection result ALM indicating anomaly detection, and outputs the generated detection result ALM to the control circuit 90.

Figure 24:
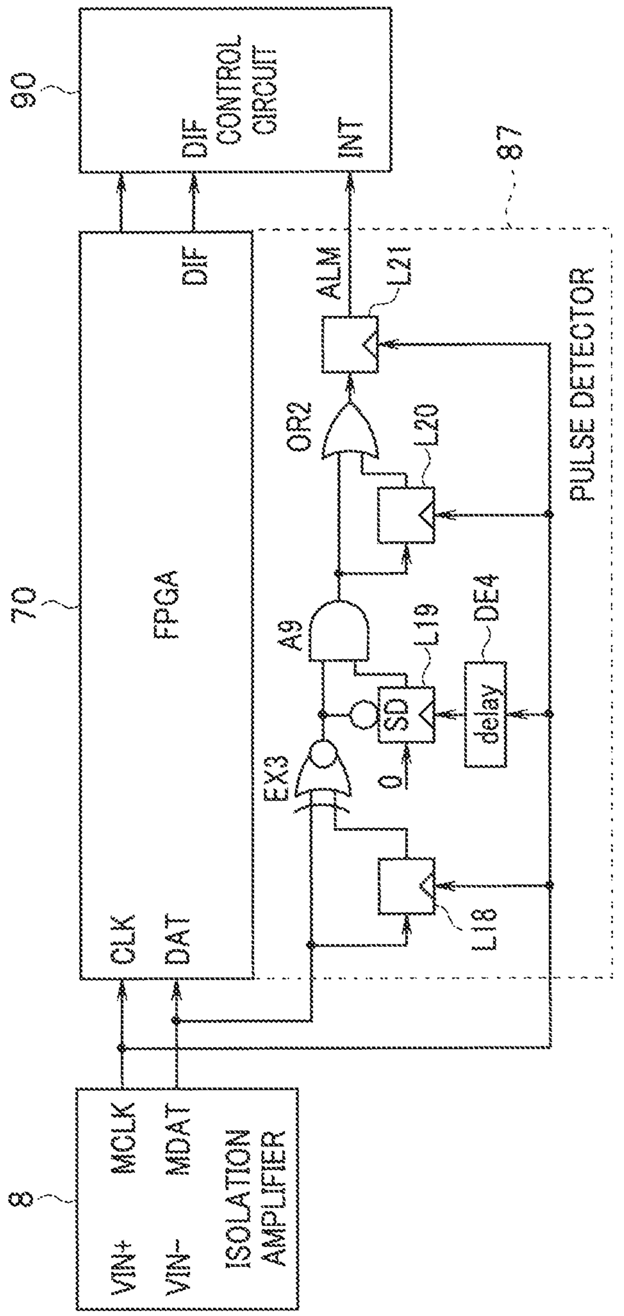
FIG. 24 is a circuit diagram illustrating an example of a specific configuration of a pulse detector 87 in FIG. 23.

FIG. 24 is a circuit diagram illustrating an example of a specific configuration of the pulse detector 87 in FIG. 23.

The clock MCLK and the output data MDAT from the isolation amplifier 8 are supplied to the pulse detector 87 as well. Specifically, the clock MCLK is supplied to latches L18, L20, and L21 and a delay circuit DE4. The output data MDAT is supplied to the latch L18 and a matching circuit EX3. The latch L18 acquires the output data MDAT at the rising edge of the clock MCLK and outputs the acquired output data MDAT to the matching circuit EX3. The matching circuit EX3 performs a matching operation that outputs the H level when the two inputs are same logic (match) or the L level when the two inputs do not match, and outputs a result of the matching operation to an AND circuit A9. The result of the matching operation at the matching circuit EX3 is inverted and provided to a latch L19 as well.

The delay circuit DE4 delays the output data MDAT by a predetermined duration and outputs the delayed output data MDAT to the latch L19. The latch L19 acquires an inversion signal of the output from the matching circuit EX3 and outputs the acquired inversion signal to the AND circuit A9 in an H-level duration of the output from the delay circuit DE4, and outputs the L level (logic value "0") to the AND circuit A9 in an L-level duration of the output from the delay circuit DE4. The AND circuit A9 outputs a result of an AND operation of the two inputs to an OR circuit OR2 and the latch L20.

The latch L20 acquires the output from the AND circuit A9 at the rising edge of the clock MCLK and outputs the acquired output to the OR circuit OR2. The OR circuit OR2 outputs a result of an OR operation of the two inputs to the latch L21. The latch L21 acquires and outputs the output from the OR circuit OR2 at the rising edge of the clock MCLK. The output from the latch L21 is supplied as the detection result ALM to the control circuit 90. As described later, a pulse included in the ineffective duration of the output data MDAT is detected by the pulse detector 87, and the detection result ALM is obtained in accordance with the pulse.

Figure 25:
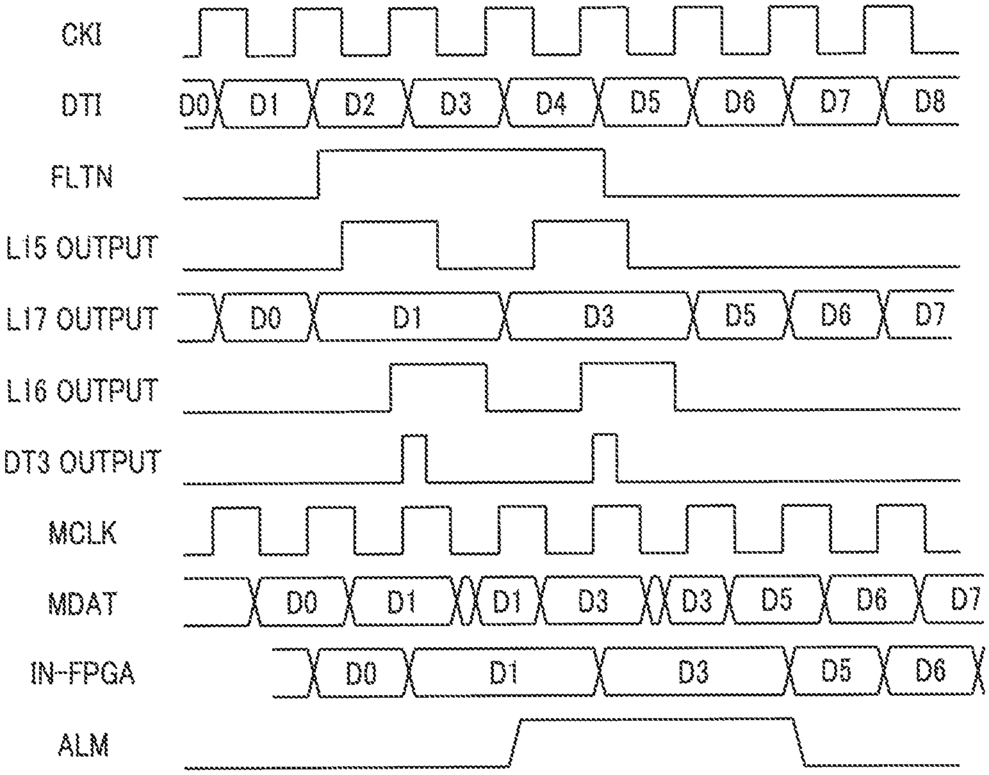
FIG. 25 is a timing chart for description of generation of a clock MCLK and output data MDAT in an isolation amplifier 8.
Figure 26:
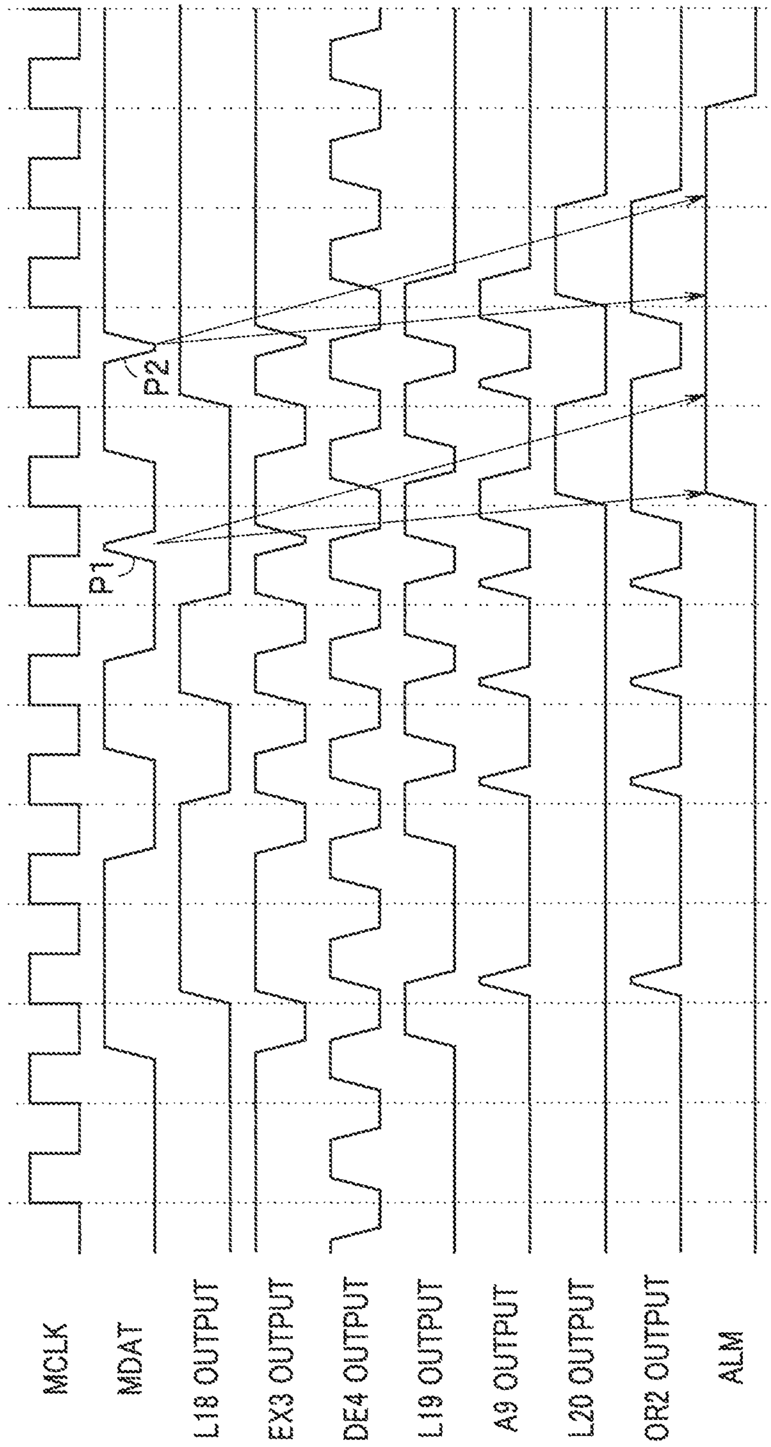
FIG. 26 is a timing chart for description of operation of the pulse detector 87.

Subsequently, operation of the embodiment thus configured will be described below with reference to FIGS. 25 and 26. FIG. 25 is a timing chart for description of generation of the clock MCLK and the output data MDAT in the isolation amplifier 8, and FIG. 26 is a timing chart for description of operation of the pulse detector 87.

The decoder 61 of the secondary circuit 60 outputs the clock CKI and also outputs the output data DTI in synchronization with the clock CKI. In FIG. 25, CKI and DTI indicate these clock and data. The clock CKI and the output data DTI are output as the clock MCLK and the output data MDAT through the mixer 140 and the buffers 63 and 64.

Assume the normal state in which no anomaly such as excessive input occurs. In this case, the detection signal FLTN is at the L level. Thus, the outputs from the latches L15 and L16 are at the L level, and the output from the XOR circuit EX1 is continuously at the L level. The selector SE6 selects the output data DTI and outputs the selected output data DTI to the latch L17. The latch L17 outputs the output data DTI to the XOR circuit EX2 at the rising edge of the clock CKI.

Since the output from L16 is at the L level, the output from DT3 is at the L level, and the output data DTI is output from the XOR circuit EX2. The output from the XOR circuit EX2 is output as the output data MDAT through the buffer 64. Accordingly, in the normal state, the clock CKI and the output data DTI are directly output as the clock MCLK and the output data MDAT.

Subsequently, assume that anomaly such as excessive input occurs and the detection signal FLTN changes to the H level. In FIG. 25, FLTN indicates this state. The XOR circuit EX1 outputs the H-level when the detection signal FLTN has changed from the L level to the H level. The output from the XOR circuit EX1 is acquired by the latch L15 at the falling edge of the clock CKI and returned to an input end. Thus, the output from the XOR circuit EX1 changes at each falling of the clock CKI in the H-level duration of the detection signal FLTN. Accordingly, the output from the latch L15 is inverted at each falling edge of the clock CKI in the H-level duration of the detection signal FLTN (L15 output in FIG. 25).

The latch L17 acquires the output from the selector SE6 at the rising edge of the clock CKI and returns the acquired output to an input end of the selector SE6. The output data DTI is directly output from the selector SE6 in the L-level duration of the detection signal FLTN, and the output data DTI one clock before, which is output from the latch L17 is output from the selector SE6 in the H-level duration of the detection signal FLTN. Thus, as illustrated in latch L17 output in FIG. 25, identical data is output from the latch L17 for two clock durations in a duration of the detection signal FLTN.

The latch L16 acquires the output from the latch L15 at the rising edge of the clock CKI and outputs the acquired output to the falling detector DT3. Thus, the output from the latch L16 is the output from the latch L15, which is delayed by the half clock period (L16 output in FIG. 25). The falling detector DT3 detects a falling edge of the latch L16 and outputs an edge detection pulse (DT3 output in FIG. 25). The XOR circuit EX2 performs an XOR operation of the outputs from the latch L17 and the falling detector DT3. The data from the latch L17 is directly output from the XOR circuit EX2 in an L-level duration of the output from the latch L16, and the data from the latch L17 is inverted and output from the XOR circuit EX2 in an H-level duration of the edge detection pulse from the latch L16. This is indicated in MDAT in FIG. 25, and a level of the data D1 is inverted in a duration corresponding to the H-level duration of the edge detection pulse.

The clock MCLK and the output data MDAT from the isolation amplifier 8 are supplied to the FPGA 70. The FPGA 70 acquires the output data MDAT in the H-level duration of the clock MCLK as illustrated in in-FPGA in FIG. 25.

The clock MCLK and the output data MDAT from the isolation amplifier 8 are also supplied to the pulse detector 87. In FIG. 26, MCLK and MDAT indicate examples of the clock MCLK and the output data MDAT supplied to the pulse detector 87. In the example of FIG. 26, the output data MDAT indicates, as the L level or H level, whether the value of data is “0” or “1”, and protruding pulses in MDAT represent pulses P1 and P2 added in the data by the mixer 140, the pulse P1 corresponding to change of the detection signal FLTN from the L level to the H level, the pulse P2 corresponding to change of the detection signal FLTN from the H level to the L level.

The latch L18 of the pulse detector 87 acquires the output data MDAT at the rising edge of the clock MCLK and outputs the acquired output data MDAT to the matching circuit EX3. As illustrated in L18 output in FIG. 26, the latch L18 outputs the output data MDAT in synchronization with the rising edge of the clock MCLK.

The output data MDAT from the isolation amplifier 8 is supplied to the matching circuit EX3, and the matching circuit EX3 outputs, to the AND circuit A9, a matching operation result that becomes the H level in a duration in which the output from the latch L18 and the input output data MDAT match and becomes the L level in a duration in which the output from the latch L18 and the input output data MDAT do not match. The matching operation result from the matching circuit EX3 is inverted and supplied to the latch L19.

The delay circuit DE4 provides, to the latch L19, an output obtained by delaying the clock MCLK by a predetermined duration (DE4 output in FIG. 26). The latch L19 acquires an inversion signal of the output from the matching circuit EX3 and outputs the acquired inversion signal to the AND circuit A9 in the H-level duration of the output from the delay circuit DE4, and outputs the L level (logic value “0”) to the AND circuit A9 in the L-level duration of the output from the delay circuit DE4.

As a result, an output that is obtained by substantially inverting the output from the matching circuit EX3 and that falls with a delay from a rising timing of the output from the matching circuit EX3 by a delay time of the delay circuit DE4 is obtained from the latch L19. Thus, as illustrated in L19 output in FIG. 26, at usual data switching timings, the output from the latch L19 has a waveform of an H-level duration slightly wider than an L-level duration of the output from the matching circuit EX3. At timings corresponding to the pulses P1 and P2 as narrow-width pulses, the output from the delay circuit DE4 becomes the L level before rising in response to rising of the pulses P1 and P2, and thus no waveform change due to the pulses P1 and P2 appears in L19 output.

The AND circuit A9 performs an AND operation of the output from the matching circuit EX3 and the output from the latch L19. As illustrated in A9 output in FIG. 26, the output from the AND circuit A9 has a narrow-width pulse waveform corresponding to a waveform in which a width of an H-level duration of the output from the latch L19 is wider than a width of an L-level duration of the matching circuit EX3. The output from the AND circuit A9 has a pulse waveform in which the H level has a wide width corresponding to a waveform of the output from the latch L19 in durations corresponding to the pulses P1 and P2.

The latch L20 acquires the output from the AND circuit A9 at the rising edge of the clock MCLK, and outputs the acquired output to the OR circuit OR2. A narrow-width pulse of the output from the latch L19 is generated after the rising timing of the clock MCLK and does not appear in the output from the latch L20. An H-level duration of the wide-width pulse of the output from the latch L19 occurs at the rising timing of the clock MCLK, and the output from the latch L20 has a pulse waveform of a width of one clock period corresponding to this wide-width pulse duration (L20 output in FIG. 26).

The OR circuit OR2 performs an OR operation of the output from the AND circuit A9 and the output from the latch L20 and obtains an output illustrated in OR2 output in FIG. 26. The output from the OR circuit OR2 is provided to the latch L21, and the latch L21 acquires and outputs the output from the OR circuit OR2 at the rising edge of the clock MCLK. As illustrated in ALM in FIG. 26, the output from the latch L21 is the detection result ALM corresponding to a duration from the pulse P1 to the pulse P2. The latch L21 outputs the detection result ALM to the control circuit 90.

In this manner, in the present embodiment as well, it is possible to obtain effects same as effects of the third embodiment.

Ninth Embodiment

Figure 27:
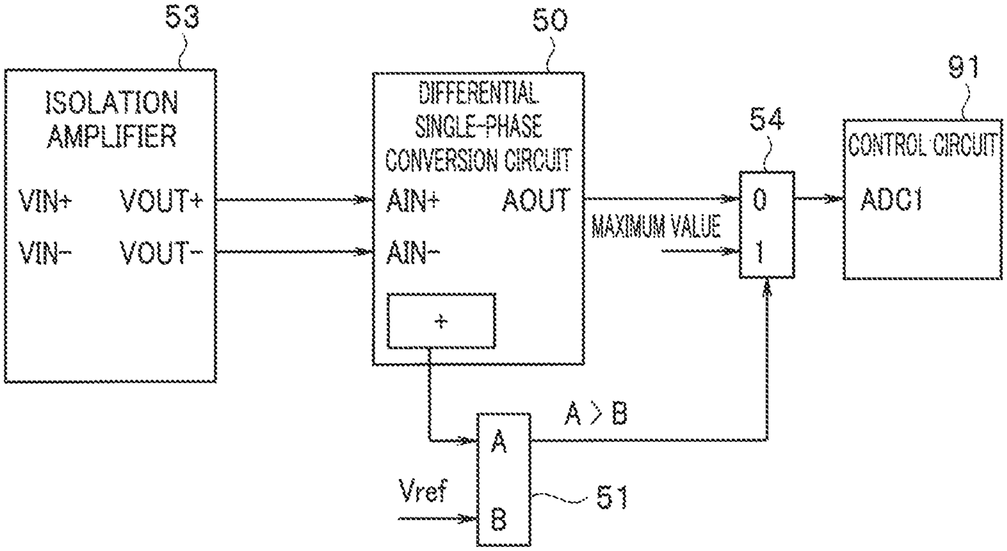
FIG. 27 corresponds to an analog-output isolation amplifier.
Figure 28:
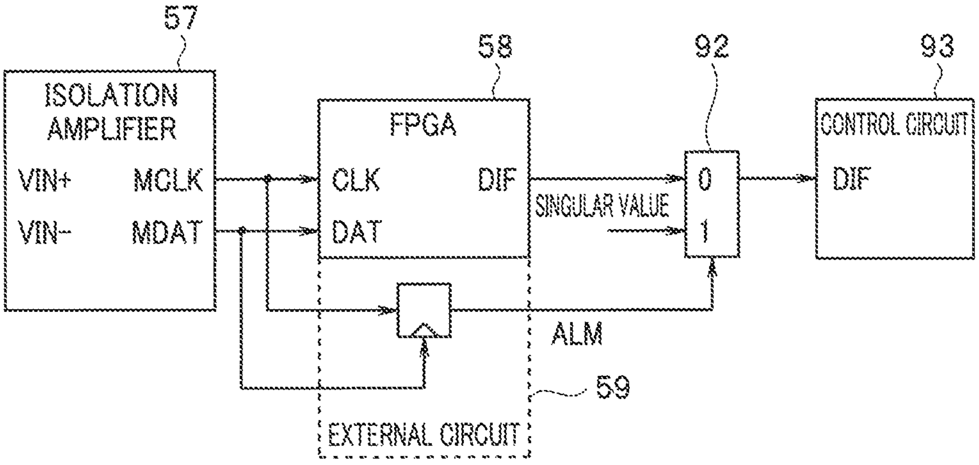
FIG. 28 is a block diagram illustrating a ninth embodiment.

FIGS. 27 and 28 are block diagrams illustrating a ninth embodiment. FIG. 27 corresponds to an analog-output isolation amplifier, and FIG. 28 corresponds to a digital-output isolation amplifier.

In the above-described embodiments, the control circuit needs two terminals, namely, a data input terminal through which data corresponding to the differential inputs VIN is input and an interrupt terminal through which an anomaly detection result is input. The present embodiment enables the control circuit to acquire data corresponding to the differential inputs VIN and an anomaly detection result through one terminal.

In FIG. 27, an isolation amplifier 53 is the isolation amplifier 1 or 2 of the first or second embodiment. The differential single-phase conversion circuit 50 adds the output differential signals VOUT+ and VOUT− from the isolation amplifier 53 and outputs a result of the addition to an A end of the anomaly detection circuit 51. The anomaly detection circuit 51 is formed with a comparator and compares the addition result A and the determination reference voltage Vref input to a B end of the anomaly detection circuit 51. The anomaly detection circuit 51 outputs the H level when a level of the A end is equal to or higher than a level of the B end, and outputs the L level when the level of the A end is lower than the level of the B end. In the present embodiment, the anomaly detection circuit 51 outputs a result of the comparison as a selection signal to a selector 54.

The selector 54 also receives the single-phase output AOUT from the differential single-phase conversion circuit 50, selects and outputs the single-phase output AOUT in response to the selection signal of the L level, and selects and outputs a predetermined maximum value in response to the selection signal of the H level. The output from the selector 54 is output to an ADC1 end of a control circuit 91.

When a signal of a normal level is input to the ADC1 end, the control circuit 91 determines that the input signal is the single-phase output AOUT, and performs processing. When a signal of a maximum level to be processed is input to the ADC1 end, the control circuit 91 determines that the input signal is an anomaly detection result indicating anomaly occurrence, and performs processing.

In this manner, when a configuration in FIG. 27 is employed, data and an anomaly detection result can be transmitted to the control circuit through one terminal.

In FIG. 28, an isolation amplifier 57, an FPGA 58, and an external circuit 59 represent the isolation amplifier 3 to 8, the FPGAs 70 and 75, and the external circuits 80, 82, and 86, respectively, of the third to eighth embodiments. The clock MCLK and the output data MDAT from the isolation amplifier 57 are input to the external circuit 59. The external circuit 59 generates the detection result ALM based on the clock MCLK and the output data MDAT.

In the present embodiment, the external circuit 59 outputs the detection result ALM as a selection signal to a selector 92. In addition, filtered data from an output end DIF of the FPGA 58 is input to the selector 92. The selector 92 selects and outputs the data from the FPGA 58 in response to the selection signal of the L level and selects and outputs a predetermined singular value in response to the selection signal of the H level. Note that the singular value is a negative maximum value or the like. The selector 92 outputs the selected output to a DIF end of a control circuit 93.

When a signal of a normal level is input to the DIF end, the control circuit 93 determines that the input signal is data from the FPGA 58, and performs processing. When a signal of a singular value is input to the DIF end, the control circuit 93 determines that the input signal is an anomaly detection result indicating anomaly occurrence, and performs processing.

In this manner, when a configuration in FIG. 28 is employed, data and an anomaly detection result can be transmitted to the control circuit through one terminal.

Tenth Embodiment

Figure 29:
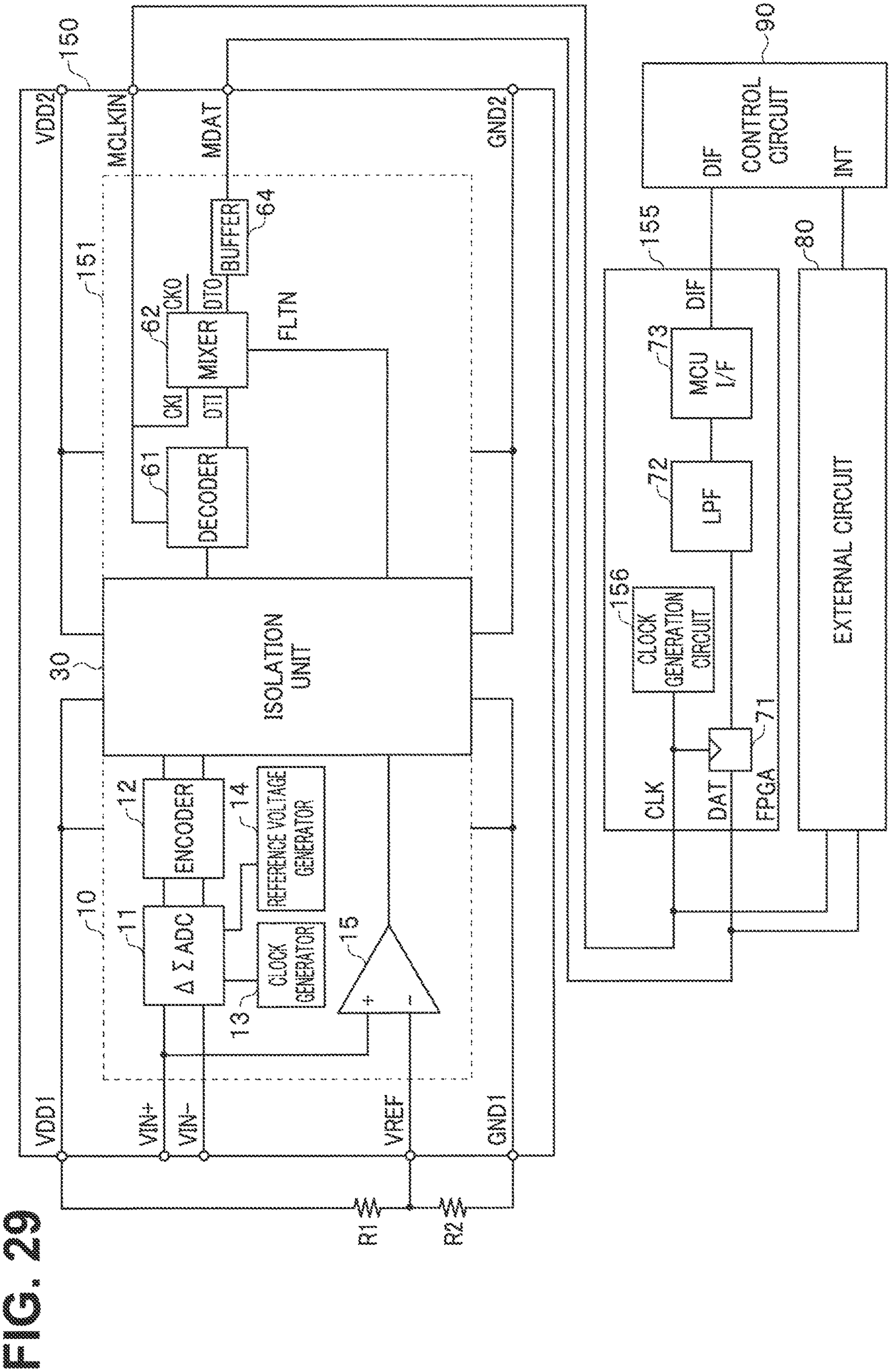
FIG. 29 is a block diagram illustrating a tenth embodiment.

FIG. 29 is a block diagram illustrating a tenth embodiment. In FIG. 29, any component same as a component in FIG. 12 is denoted by the same reference sign, and description of the component will be omitted. The embodiment illustrated in FIG. 12 describes an example in which a built-in clock (the clock MCLK) generated in the secondary circuit 60 of the isolation amplifier 3 is used, but the present embodiment describes an example in which an external clock produced outside is used as the clock MCLK.

A secondary circuit 151 of an isolation amplifier 150 in FIG. 29 is different from the secondary circuit 60 of the isolation amplifier 3 in that the clock regeneration circuit 24 and the buffer 63 are omitted. The clock MCLK from the outside is input as a clock MCLKIN to the isolation amplifier 150 through a clock input end. By using the clock MCLKIN, the decoder 61 of the secondary circuit 151 decodes a differential signal forwarded from the isolation unit 30 and generates the output data DTI corresponding to the differential inputs VIN. Similarly to the mixer 62 of the isolation amplifier 3, the mixer 62 of the secondary circuit 151 outputs the output data DTO obtained by changing the output data DTI in accordance with the detection signal FLTN. Note that the mixer 62 of the secondary circuit 151 does not output the clock.

In an example of FIG. 29, the clock MCLK is generated by a clock generation circuit 156 provided in an FPGA 155. The FPGA 155 is different from the FPGA 70 in that the clock generation circuit 156 is additionally provided. The clock generation circuit 156 provides the generated clock MCLK to the latch 71 and also to the clock input end of the isolation amplifier 150.

The present embodiment is different from the embodiment illustrated in FIG. 12 in that an external clock is used in place of a built-in clock, and other components and effects are same as components and effects of the embodiment illustrated in FIG. 12.

Note that the present embodiment described an example of application to the third embodiment illustrated in FIG. 12, but is also applicable to the third to sixth, eighth, and ninth embodiments except for the seventh embodiment in which a clock is processed.

(Modification)

Figure 30:
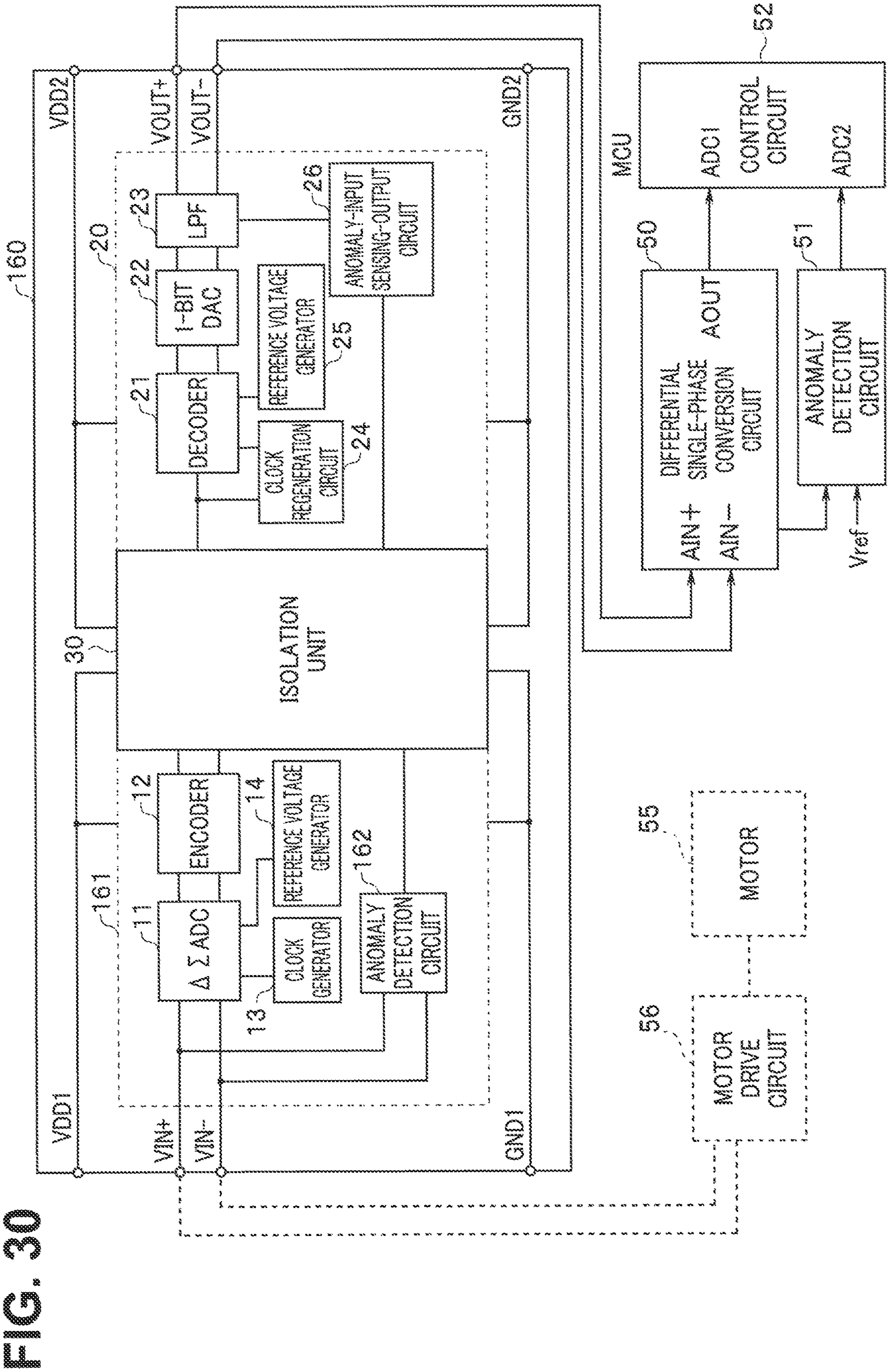
FIG. 30 is a block diagram illustrating a modification.

FIG. 30 is a block diagram illustrating a modification. In FIG. 30, any component same as a component in FIG. 1 is denoted by the same reference sign, and description of the component will be omitted.

The embodiment illustrated in FIG. 1 describes an example in which detection information is generated by the resistors R1 and R2 and the comparator 15, which are externally provided, but a circuit configured to generate detection information may be included. FIG. 30 illustrates an example in this case.

A primary circuit 161 of an isolation amplifier 160 in FIG. 30 is different from the primary circuit 10 of the isolation amplifier 1 in that an anomaly detection circuit 162 is employed in place of the comparator 15. In the present modification, the resistors R1 and R2 are omitted. The input differential signals VIN+ and VIN− are provided to the anomaly detection circuit 162. The anomaly detection circuit 162 detects anomaly occurrence based on the input differential signals VIN+ and VIN−. For example, the anomaly detection circuit 162 may detect anomaly occurrence by dividing the differential input VIN and comparing the divided differential input VIN with the predetermined detection voltage VREF. The anomaly detection circuit 162 outputs a detection signal indicating existence of anomaly occurrence to the secondary circuit 20 through the isolation unit 30.

Other components and effects are same as components and effects of the first embodiment.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. An isolation amplifier comprising:

a primary circuit including an analog-digital conversion circuit and an encoder, the analog-digital conversion circuit being configured to convert input differential signals provided from a detection target device into digital signals, the encoder being configured to encode and output an output from the analog-digital conversion circuit;

an anomaly detection circuit provided in the primary circuit and configured to detect level anomaly having occurred to the input differential signals and generate a detection signal;

an isolation unit insulating the primary circuit from a secondary circuit and configured to transmit the output from the encoder and the detection signal to the secondary circuit;

an output circuit provided in the secondary circuit, including a decoder, and configured to generate output differential signals corresponding to the input differential signals, the decoder being configured to receive the output from the encoder and the detection signal that are transmitted by the isolation unit and perform decoding corresponding to the encoding; and an anomaly-input sensing-output circuit provided in the secondary circuit and configured to, in a duration in which level anomaly occurrence is not indicated in the input differential signals, directly output the output differential signals obtained by the decoding of the output circuit, and in a duration in which level anomaly occurrence is indicated in the input differential signals, change respective in-phase levels of the output differential signals obtained by the decoding of the output circuit and output the output differential signals, the in-phase levels of which have been changed.

2. The isolation amplifier according to claim 1, wherein the output circuit includes a digital-analog conversion circuit and a low-pass filter, the digital-analog conversion circuit being configured to convert an output from the decoder into an analog signal, the low-pass filter being configured to generate the output differential signals by restricting a high-frequency component of an output from the digital-analog conversion circuits.

3. The isolation amplifier according to claim 2, wherein the anomaly-input sensing-output circuit changes, by a same predetermined level, in-phase levels of a pair of respective differential signals of the output differential signals in a duration in which anomaly occurrence is indicated by the detection signal.

4. The isolation amplifier according to claim 1, wherein the anomaly-input sensing-output circuit outputs signals of a predetermined level in place of the pair of differential signals of the output differential signals in a duration in which anomaly occurrence is indicated by the detection signal.

5. An anomaly state detection device comprising:

the isolation amplifier according to claim 1; and a detection circuit configured to detect whether the input differential signals provided by the detection target device have level anomaly based on output differential signals from the isolation amplifier and output a result of the anomaly detection to a control circuit.

6. The anomaly state detection device according to claim 5, further comprising:

a processing circuit configured to output signals corresponding to the input differential signals included in the output differential signals from the isolation amplifier; and a selector configured to output an output from the processing circuit and a signal indicating anomaly occurrence to the input differential signals to a common terminal of the control circuit in a switching manner based on the result of the anomaly detection from the detection circuit.

7. An isolation amplifier comprising:

a primary circuit including an analog-digital conversion circuit and an encoder, the analog-digital conversion circuit being configured to convert input differential signals provided from a detection target device into digital signals, the encoder being configured to encode and output an output from the analog-digital conversion circuit;

an anomaly detection circuit provided in the primary circuit and configured to detect level anomaly having occurred to the input differential signals and generate a detection signal;

an isolation unit insulating the primary circuit from a secondary circuit and configured to transmit the output from the encoder and the detection signal to the secondary circuit;

an output circuit provided in the secondary circuit, including a decoder, and configured to generate output differential signals corresponding to the input differential signals, the decoder being configured to receive the output from the encoder and the detection signal that are transmitted by the isolation unit and perform decoding corresponding to the encoding; and an anomaly-input sensing-output circuit provided in the secondary circuit and configured to, in a duration in which level anomaly occurrence is not indicated in the input differential signals, directly output the output differential signals obtained by the decoding of the output circuit, and in a duration in which level anomaly occurrence is indicated in the input differential signals, change the output differential signals obtained by the decoding of the output circuit by a predetermined law and output the changed output differential signals, wherein the decoder outputs digital output differential signals corresponding to the input differential signals, the output differential signals from the output circuit are the digital output differential signals generated by the decoder, and the anomaly-input sensing-output circuit changes a logic level of the digital output differential signals from the decoder in accordance with a duration in which anomaly occurrence is indicated by the detection signal.

8. The isolation amplifier according to claim 7, wherein in a duration in which anomaly occurrence is indicated by the detection signal, the anomaly-input sensing-output circuit outputs a logic level of the digital output differential signals from the decoder in synchronization with one edge of a clock and forcibly changes the logic level to one logic level in synchronization with another edge of the clock.

9. The isolation amplifier according to claim 8, wherein the anomaly-input sensing-output circuit forcibly changes the logic level of the digital output differential signals from the decoder in an output duration of one piece of data at timings corresponding to start and end timings of anomaly occurrence indicated by the detection signal.

10. The isolation amplifier according to claim 8, wherein the anomaly-input sensing-output circuit forcibly changes the logic level of the digital output differential signals from the decoder to one logic level and then to another logic level in an output duration of one piece of data at timings corresponding to start and end timings of anomaly occurrence indicated by the detection signal.

11. The isolation amplifier according to claim 7, wherein the anomaly-input sensing-output circuit outputs the digital output differential signals in synchronization with one edge of a clock, and in a duration in which anomaly occurrence is indicated by the detection signal, outputs, in synchronization with another edge of the clock, a logic level that is different from a logic level that the anomaly-input sensing-output circuit outputs in a duration other than the duration.

12. The isolation amplifier according to claim 7, wherein the decoder outputs not only a digital output differential signals but also a clock, the output differential signals from the output circuit are not only the digital output differential signals but also the clock, and the anomaly-input sensing-output circuit changes a duty ratio of the clock from the decoder between a duration in which anomaly occurrence is indicated by the detection signal and a duration other than the duration.

13. The isolation amplifier according to claim 7, wherein in an ineffective duration within a duration of data of the digital output differential signals from the decoder, the ineffective duration corresponding to start and end timings of anomaly occurrence indicated by the detection signal, the anomaly-input sensing-output circuit generates a narrow-width pulse by changing a logic level of the data to a different logic level and then immediately changing back.

14. An anomaly state detection device comprising:

the isolation amplifier according to claim 7; and a detection circuit configured to detect whether the input differential signals provided by the detection target device have level anomaly based on output differential signals from the isolation amplifier and output a result of the anomaly detection to a control circuit.

15. The anomaly state detection device according to claim 14, further comprising:

a processing circuit configured to output signals corresponding to the input differential signals included in the output differential signals from the isolation amplifier; and a selector configured to output an output from the processing circuit and a signal indicating anomaly occurrence to the input differential signals to a common terminal of the control circuit in a switching manner based on the result of the anomaly detection from the detection circuit.

* * * * *